(12) United States Patent  
Johnson et al.

(10) Patent No.: US 8,837,547 B2  
(45) Date of Patent: Sep. 16, 2014

(54) LASERS WITH INGAAS QUANTUM WELLS WITH INGAP BARRIER LAYERS WITH REDUCED DECOMPOSITION

(75) Inventors: Ralph H. Johnson, Murphy, TX (US); Jerome K. Wade, Austin, TX (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 13/423,826

(22) Filed: Mar. 19, 2012

(65) Prior Publication Data

US 2012/0236892 A1  Sep. 20, 2012

Related U.S. Application Data

(60) Provisional application No. 61/453,851, filed on Mar. 17, 2011, provisional application No. 61/453,635, filed on Mar. 17, 2011.

(51) Int. Cl.
| H01S 5/34 | (2006.01) |
| B82Y 20/00 | (2011.01) |
| H01S 5/343 | (2006.01) |
| H01S 5/00 | (2006.01) |
| H01S 5/183 | (2006.01) |

(52) U.S. Cl.
CPC .......... *H01S 5/3407* (2013.01); *H01S 5/34373* (2013.01); *H01S 5/3436* (2013.01); *B82Y 20/00* (2013.01); *H01S 5/0021* (2013.01); *H01S 5/18311* (2013.01); *H01S 5/34313* (2013.01); *H01S 5/34366* (2013.01)
USPC ................ 372/45.012; 372/43.01; 372/44.01; 372/45.01

(58) Field of Classification Search
CPC ... H01S 5/343; H01S 5/34313; H01S 5/3434; H01S 5/3436; H01S 5/34373
USPC ................... 372/43.01, 44.01, 45.01, 45.015, 372/45.012
See application file for complete search history.

(56) References Cited

U.S. PATENT DOCUMENTS 4,953,170 A * 8/1990 Logan et al. ............... 372/44.01
5,319,657 A * 6/1994 Otsuka et al. ............. 372/43.01

(Continued)

FOREIGN PATENT DOCUMENTS

JP   07-235730 A   9/1995
JP   2007-219561   8/2007

(Continued)

OTHER PUBLICATIONS

Kuo et al., "MOCVD Growth of High-Performance InGaAsP/InGaP Strain-Compensated VCSELs with 850 nm Emission Wavelength," 2004, Journal of Crystal Growth, 261, 355-358.*

(Continued)

*Primary Examiner* — Julio J Maldonado
*Assistant Examiner* — Joshua King
(74) *Attorney, Agent, or Firm* — Maschoff Brennan

(57) ABSTRACT

A method for preparing a VCSEL can use MBE for: growing a first conduction region over a first mirror region; growing an active region over the first conduction region opposite of the first mirror region, including: (a) growing a quantum well barrier having $In_{1-x}Ga_xP(As)$; (b) growing an transitional layer having one or more of GaP, GaAsP, or GaAs; (c) growing a quantum well layer having $In_{1-z}Ga_zAsyP_{1-y}$; (d) growing another transitional layer have one or more of GaP, GaAsP, or GaAs; (e) repeating processes (a) through (d) over a plurality of cycles; and (f) growing a quantum well barrier having $In_{1-x}Ga_xP(As)$; growing a second conduction region over the active region opposite of the first conduction region, wherein: x ranges from 0.77 to 0.50; y ranges from 0.7 to 1; and z ranges from 0.7 to 0.99.

13 Claims, 16 Drawing Sheets

(56) References Cited

U.S. PATENT DOCUMENTS

| | | | |
|---|---|---|---|
| 5,579,331 A | | 11/1996 | Shen et al. |
| 5,937,273 A | * | 8/1999 | Fujii et al. ........................ 438/46 |
| 6,167,073 A | * | 12/2000 | Botez et al. ................. 372/46.01 |
| 6,219,365 B1 | * | 4/2001 | Mawst et al. ............. 372/46.016 |
| 6,229,152 B1 | | 5/2001 | Dries et al. |
| 6,449,300 B1 | | 9/2002 | Iga et al. |
| 6,803,604 B2 | | 10/2004 | Takahashi et al. |
| 7,269,196 B2 | * | 9/2007 | Tandon et al. .............. 372/45.01 |
| 7,872,270 B2 | | 1/2011 | Takahashi et al. |
| 2004/0101009 A1 | * | 5/2004 | Johnson et al. ................. 372/45 |
| 2004/0233953 A1 | * | 11/2004 | Sato ................................ 372/44 |
| 2005/0040386 A1 | * | 2/2005 | Choa ............................... 257/14 |
| 2005/0230674 A1 | | 10/2005 | Takahashi et al. |
| 2007/0297474 A1 | * | 12/2007 | Sakong et al. ............. 372/43.01 |
| 2008/0012002 A1 | | 1/2008 | Sakong et al. |
| 2009/0295902 A1 | * | 12/2009 | Sato et al. ...................... 347/224 |
| 2012/0236891 A1 | | 9/2012 | Johnson et al. |

FOREIGN PATENT DOCUMENTS

| | | | | | |
|---|---|---|---|---|---|
| JP | 2007219561 A | * | 8/2007 | .............. | G06F 1/017 |
| KR | 10-2008-0006745 A | | 1/2008 | | |
| WO | WO 2006044124 A1 | * | 4/2006 | ................ | H01S 5/00 |
| WO | 2012/125997 | | 9/2012 | | |
| WO | 2012/126001 | | 9/2012 | | |

OTHER PUBLICATIONS

Bhat et al., "Interface Control in GaAs/GaInP Superlattices Grown by OMCVD," Nov. 1, 1992, Journal of Crystal Growth, vol. 124, issues 1-4, 576-582.*

Lee et al., "Absorption Changes in a Strained InGaAs/InGaP Superlattice and a Strain-Balanced InGaAs/InGaP MQW Structure," Nov. 5, 2004, Journal of the Korean Physical Society, vol. 45, No. 5, 1185-1188.*

International Search Report dated Oct. 29, 2012 as received in application No. PCT/US2012/029658.

Written Opinion of the International Searching Authority dated Oct. 29, 2012 as received in application No. PCT/US2012/029658.

Bhattacharya, A. et al., Interface structures of InGaAs/InGaAsP/InGaP quantum well laser diodes grown by metalorganic chemical vapor deposition on GaAs substrates, Applied Physics Letters, Apr. 15, 1996 pp. 2240-2242, vol. 68, Issue 16.

Bugge, F. et al., MOVPE Growth of AlGaAs/GaAs/GaInP Diode Lasers, Journal of Electronic Materials, 2000, pp. 57-61, vol. 229, No. 1.

Chang, Y. et al., Fabrication and Characteristics of High-Speed Oxide-Confined VCSELs Using InGaAsP-InGaP Strain-Compensated MQWs, Journal of Lightwave Technology, Dec. 2004, pp. 2828-2833, vol. 22, No. 12.

Chen, H. et al., InGaAs/InP quantum well intermixing studied by cross-sectional scanning tunneling microscopy, Journal of Elctronic Material, Jul. 1999, vol. 28, Issue 7.

Chen, Y.K. et al., Self-aligned InGaAs/GaAs/InGaP quantum well lasers prepared by gas-source molecular beam epitaxy with two growth steps, Applied Physics Letters, Dec. 1991, pp. 2929-2931, vol. 59, No. 23.

Khazanova, S.V. et al., Modelling of the composition segregation effect during epitaxial growth of InGaAs quantum well heterostructures, Semiconductor Science and Technology, Jul. 23, 2010, pp. 1-7, vol. 25, IOP Publishing Ltd.

Knauer, A. et al., Interlayer formation due to group V-hydride stabilization during interruptions of MOVPE growth in InGaP, Semiconductor Science and Technology, 2004, pp. 680-684, vol. 19, No. 6.

Knauer, A. et al., High-power 808 nm lasers with a super-large optical cavity, Semiconductor Science and Technology, 2005, pp. 621-624, vol. 20, No. 6.

Knauer, A. et al., Properties of (In,Ga) (As,P) / GaAs interfaces grown under different metalorganic vapor phase epitaxy conditions, Journal of Crystal Growth, Feb. 2003, pp. 364-368, vol. 248, Elsevier B.V.

Knauer, A. et al., Influence of Oxygen in AlGaAs-Based Laser Structures with Al-Free Active Region on Device Properties, Journal of Electronic Materials, 2001, pp. 1421-1424, vol. 30. No.

Krispin, P. et al, Type-II band alignment between GaAs and inadvertent interlayers at (In,Ga)P/GaAs interfaces, Applied Physics Letters, Jul. 8, 2002, vol. 81, No. 2.

Kudela, R. et al., Study of narrow InGaP/(In)GaAs quantum wells, Journal of Crystal Growth, 2002, pp. 132-140, vol. 242, Issues 1-2, Elsevier B.V.

Kuo, Y.-K. et al., Numerical study on strained InGaAsP/InGaP quantum wells for 850-nm vertical-cavity surface-emitting lasers, Applied Physics B, Mar. 2007, pp. 623-631, vol. 86, No. 4.

Lew, A.Y. et al., Interface Structure in Arsenide/Phosphide Heterostructures Grown by Gas-Source MBE and Low-Pressure MOVPE, Journal of Electronic Materials, 1997, pp. 64-69, vol. 26, No. 2.

Martini, S. et al., In-situ Determination of Indium Segregation in InGaAs/GaAs Quantum Wells Grown by Molecular Beam Epitaxy, Brazilian Journal of Physics, Jun. 2002, pp. 359-361 vol. 32, No. 2A.

Martini, S. et al., In-segregation measurements by RHEED during growth: comparison between vicinal and nominal substrates, Aip Conference Prodeedings, 2007, pp. 17-18, vol. 893, Part A, Iop Institute of Physics Publishing, Ltd.

Martinez-Pastor, J. et al., Optical study of good quality InGaP/GaAs quantum wells: Influence of the indium content around the lattice-matched composition, Applied Physics Letters, Apr. 8, 1996, pp. 211-2113, vol. 65, No. 15, American Institute of Physics.

Mawst, L.J. et al., High continuous wave output power InGaAs/InGaP diode lasers: Effect of substrate misorientation, Applied Physics Letters, Nov. 13, 1995, pp. 2901-2903, vol. 67, Issue 20.

Qureshi, Z. et al., Analouge Modulation Performance of 20 GHz Directly Modulated High-Speed Vertical-Cavity Sutface-Emitting Lasers, 36th European Conference and Exhibition on Optical Communication (ECOC 2010), Sep. 19- 23, 2010, Turin, Italy.

Reithmaier, J.-P., et al., Indium desorption during MBE growth of strained InGaAs layers, Journal of Crystal Growth III, 1991, pp. 407-412, North Holland.

Schneider Jr, R.P. et al., GaInAsP/AlGaInP-based near-IR (780 nm) vertical-cavity surface-emitting lasers, Electronic Letters, Mar. 30, 1995, pp. 554-556, vol. 31, No. 7.

Shang, X.Z. et al., Optical properties of highly disordered InGaP by solid-source molecular beam epitaxy with a GaP decomposition source, Journal of Crystal Growth 262, Feb. 2004, pp. 14-18, Elsevier B.V.

Streubel, K. et al., Hight Brightness AlGaInP Light-Emitting Diodes, IEEE Journal on Selected Topics in Quantum Electronics, Mar./Apr. 2002, vol. 8, No. 2.

Stringfellow, G., Immiscibility and spinodal decomposition in III /V Alloys, Journal of Crystal Growth, 1983, pp. 454-462, vol. 65, Issue 1-3.

Sumpf, B. et al., Tensile-Strained GaAsP-AlGaAs Laser Diodes for Reliable 1.2-W Continuous-Wave Operation at 735 nm, IEEE Photonics Technology Letters, Jan. 2001, pp. 7-9, vol. 13, No. 1.

Tansu, N. et al., Low-Temperature Sensitive, Compressively Strained InGaAsP Active ( $\lambda$= 0.78-0.85 µm) Region Diode Lasers, IEEE Photonics Technology Letters, Jun. 2000, pp. 603-605, vol. 12, No. 6.

Usami, M. et al., 0.98-µm InGaAs—InGaP Strained Quantum-Well Lasers with GaAs—InGaP Superlattice Optical Confinement Layer, IEEE Journal of Selected Topics in Quantum Electronics, Jun. 1995, pp. 244-249, vol. 1, No. 2.

Wade, J., High-Power InGaAsP-Active Diode Lasers at $\lambda$= 808 nm, Dissertation submitted in partial fullfillment of the requirements for the degree of Doctor of Philosophy, 2004, pp. 1-124, ProQuest Information and Learning Company, Ann Arbor Michigan.

Yagisawa, T. et al., 30-Gb/s VCSEL Transmitter Fabricated on Flexible Printed Circuit Substrate, 36th European Conference and Exhibition on Optical Communication (ECOC 2010), Sep. 19- 23, 2010, pp. 1-3 Turin, Italy.

International Search Report and Written Opinion mailed Oct. 29, 2012 in related PCT International Application No. PCT/US2012/029635.

Office Action dated Dec. 27, 2013 in related U.S. Appl. No. 13/423,550.

* cited by examiner

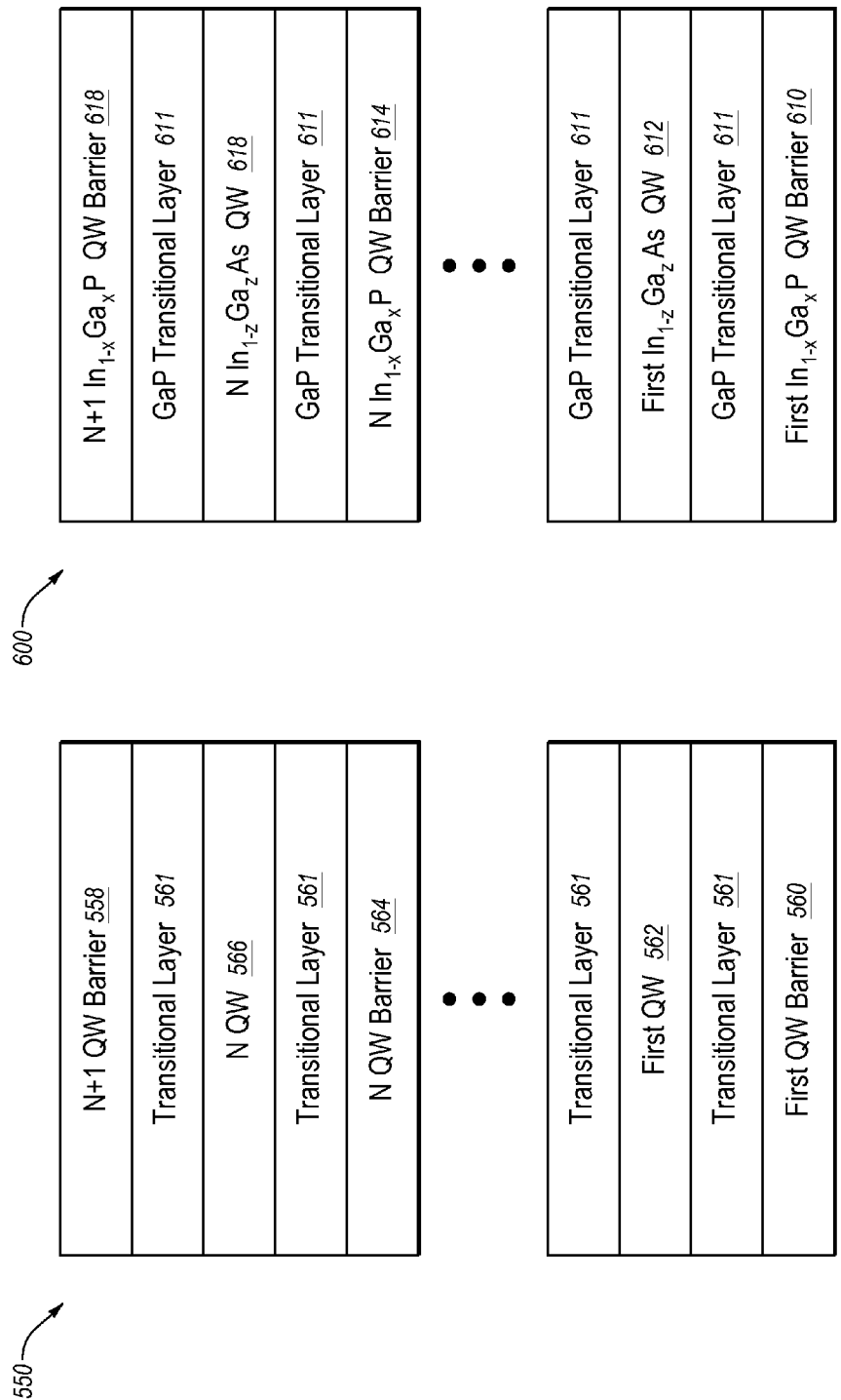

LASERS WITH INGAAS QUANTUM WELLS WITH INGAP BARRIER LAYERS WITH REDUCED DECOMPOSITION

CROSS-REFERENCE

The present application claims the benefit of U.S. Provisional Application 61/453,851, filed on Mar. 17, 2011, and U.S. Provisional Application 61/453,635, filed on Mar. 17, 2011, which provisional applications are incorporated herein by specific reference in their entirety.

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g. a p-type mirror and an n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons to recombine with holes in the conduction band to the valance band which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

It has been determined that the composition of the active region of a VCSEL can determine the functionality of the laser. Particularly, if the compositions of quantum wells and the barrier layers that surround quantum wells are not prepared carefully, the elements of the quantum well can interdiffuse into the barrier layer and recombine with elements of the barrier layer, and elements of the barrier layer can interdiffuse into the quantum well can recombine with elements of the quantum well. Such interdiffusion and cross-combination can result in a region between the quantum wells and barrier layers that is energetically less favorable for a laser. Thus, it can be advantageous to design an active region to prevent such interdiffusion and cross-combination of elements.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, a VCSEL can include: one or more quantum wells having InGaAs; two or more quantum well barriers having InGaP bounding the one or more quantum well layers; and one or more transitional monolayers having one or more of GaP, GaAsP, or GaAs deposited between each quantum well layer and quantum well barrier.

In one embodiment, a VCSEL can have: one or more quantum wells having $In_{1-z}Ga_zAs_yP_{1-y}$; two or more quantum well barriers having $In_{1-x}Ga_xP(As)$ bounding the one or more quantum well layers; and one or more transitional monolayers having one or more of GaP, GaAsP, or GaAs deposited between each quantum well layer and quantum well barrier. Here, x expresses the percent of Ga in a quantum well barrier and ranges from 0.77 to about 0.65; y expresses the percent of As in a quantum well and ranges from 0.9 to about 0.95; and z expresses the percent of Ga in the quantum well expresses the percent of ranges from 0.7 to 0.99. In one aspect, x ranges from 0.75 to 0.5; y ranges from 0.7 to 1; and z ranges from 0.7 to 0.99.

In one embodiment, the one or more quantum wells have $In_{1-z}Ga_zAs$; the one or more quantum well barriers have $In_{1-x}Ga_xP$; and the one or more transitional monolayers have GaAsP or GaP deposited between each quantum well layer and quantum well barrier. In one option, one or more transitional monolayers have GaAs deposited between each quantum well layer and quantum well barrier. In one aspect, the one or more transitional monolayers can be formed from GaAsP or GaP or GaAs such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the one or more transitional monolayers can include InGaP or InGaAsP formed from one or more deposited monolayers of GaP or GaAs or GaAsP such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the quantum well barriers can be configured to inhibit carrier wavefunction evanescence into the quantum well barriers. The inhibition of evanescence is compared to the VCSEL without the quantum well transitional monolayers.

In one embodiment, the transitional monolayers are configured to increase differential gain of the active region. The increase of differential gain is compared to the VCSEL without the one or more transitional monolayers.

In one embodiment, the VCSEL can include an oxide layer between the one or more quantum well barrier layers and at least one of a first conduction region and a second conduction region bounding the quantum well barrier layers, wherein the oxide layer is: a double oxide configured to reduce capacitance; or at a first null with respect to the one or more quantum wells and an associated mirror region.

In one embodiment, a method for preparing a VCSEL can include: using molecular beam epitaxy (MBE) for growing a crystalline structure having: the one or more quantum wells; the two or more quantum well barriers bounding each of the one or more quantum wells; and the one or more transitional monolayers deposited between each quantum well layer and quantum well barrier.

In one embodiment, a method for preparing a VCSEL can include forming one or more transitional monolayers between the quantum well barrier and quantum well with MBE. The one or more transitional monolayers can include InGaP or InGaAsP formed from one or more deposited monolayers of GaP or GaAsP such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, a method for preparing a VCSEL can use MBE for: growing a GaAs substrate; growing a first mirror region over the GaAs substrate, the first mirror region having a plurality of first mirror layers having one or more indices of refraction; growing a first conduction region over the first mirror region; growing an active region over the first conduction region opposite of the first mirror region, the growth of the active region comprising: (a) growing a quantum well barrier having $In_{1-x}Ga_xP(As)$; (b) growing an transitional layer having one or more of GaP, GaAsP, or GaAs; (c) growing a quantum well layer having $In_{1-z}Ga_zAsyP_{1-y}$; (d) growing another transitional layer of one or more of GaP, GaAsP, or GaAs; (e) repeating processes (a) through (d) over a plurality of cycles; and (f) growing a final quantum well barrier having $In_{1-x}Ga_xP(As)$ over the last transitional layer of the active region; growing a second conduction region over the active region opposite of the first conduction region; and growing a second mirror region over the second conduction region, the second mirror region having a plurality of second mirror layers having one or more indices of refraction.

In one embodiment, a VCSEL can have: a quantum well barrier prepared from a first material; a quantum well prepared from a second material; and one or more transitional monolayers between the quantum well barrier and quantum well. The one or more transitional monolayers can be formed from a third material selected such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIGS. 5A-5C are schematics of different embodiments of active regions of VCSELs;

FIG. 6 is a schematic of an embodiment of an active region of a VCSEL;

Figure 1:
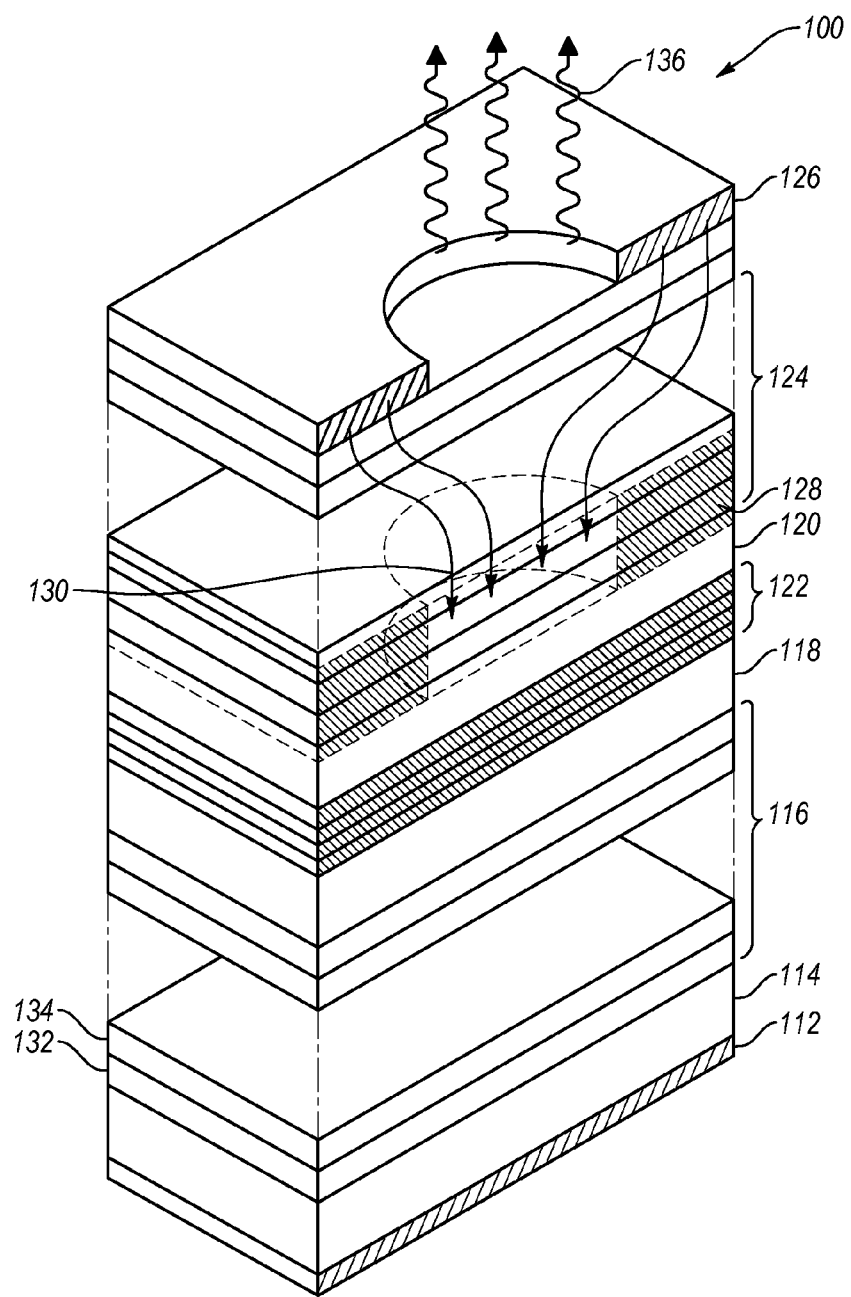
FIG. 1 is a schematic of an embodiment of a VCSEL operating environment.

all arranged in accordance with at least one of the embodiments described herein, and which arrangement may be modified in accordance with the disclosure provided herein by one of ordinary skill in the art.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The semiconductor devices of the present invention can be manufactured from any type of semiconductor. Examples of suitable materials include III-V semiconductor materials (e.g., prepared from one or more Group III material (boron (B), aluminium (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed))) and optionally some type IV materials.

The semiconductor device can include an active region having one or more quantum wells and one or more quantum well barriers. The quantum wells and quantum well barriers can be separated by one or more transitional layers therebetween. The transitional layers may also be referred to as interfacial layers as they are located at the interface between the quantum wells and quantum well barriers. Electrical confining layers can sandwich the active region and provide optical gain efficiency by confining carriers to the active region. The confining layers can have a region of high energy band gap which in the case of many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and increases the efficiency in the active region. In an exemplary embodiment, the high aluminum region may also include an increase in doping. The confining layer can be doped with a p-type or n-type dopant depending on whether the confinement barrier is on the n-side or p-side of the active region.

Figure 3:
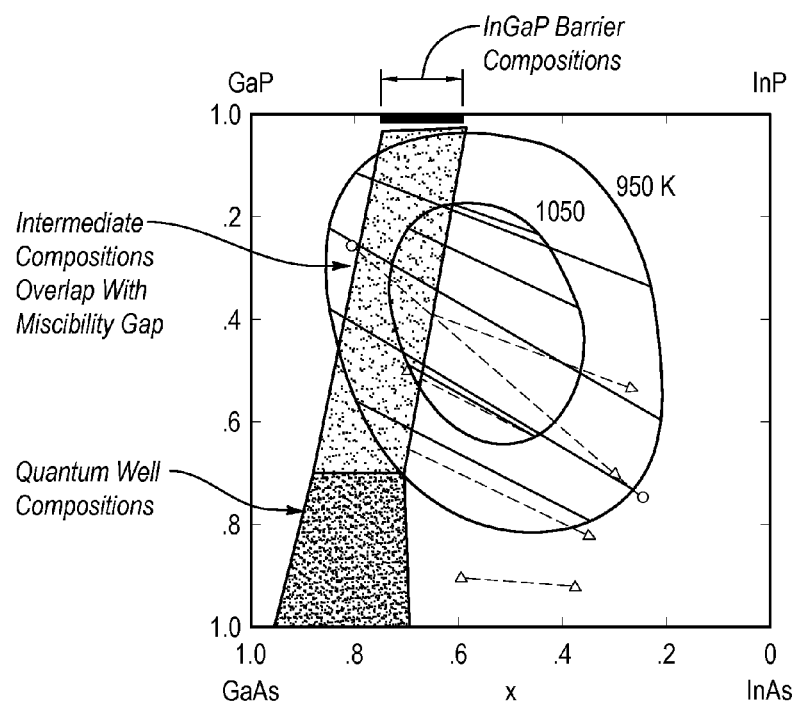
FIG. 3 is a graph showing binodial isotherms for a composition having $In_{1-x}Ga_xAs_yP_{1-y}$.

The quantum wells can include InGaAsP quantum wells with InGaP quantum well barriers with GaP, GaAs, or GaAsP transitional layers between the quantum wells and barriers. FIG. 3 includes a graph that illustrates the compositions of the quantum wells, quantum well barriers, and transitional layers that can be used in a VCSEL in accordance with the invention. Here, the transitional layers can have any composition in the defined range within the area as shown, and in one example can include a ramp of compositional change from the quantum well to the quantum well barrier.

For purposes of this invention, the content of Indium (In) and Gallium (Ga) in an InGaP or other system having In and Ga refers to the percent of In or Ga in the InGa fraction. Also, for purposes of this invention, the content of Arsenic (As) and Phosphorus (P) in a InGaAsP system or other system having As and P to the percent of As or P in the AsP fraction. When either As or P is shown in parentheses (e.g., (As) or (P)) within an elemental formula, it indicates that the element is present in low amounts or traces. Low amounts would be less than 5% or less than 1%.

In one embodiment, the active region can include an $In_{1-x}Ga_xP$ quantum well barrier layer, where x represents the group III mole fraction of Ga in a quantum well barrier and can range from about 0.75 to about 0.50, or about 0.72 to about 0.60, or about 0.71 to about 0.65, or about 0.70, and where 1-x represents the group III mole fraction of In in a quantum well barrier and can range from about 0.25 to about 0.60, or about 0.27 to about 0.50, or about 0.28 to about 0.40, or about 0.32. In one example, the InGaP quantum well barrier can have about 0.32-0.35 In or 32-55% In. As used herein, the mole fractions represent the percentages used, where the mole fraction can be multiplied by 100 to obtain the percentage.

In one embodiment, the active region can include an $In_{1-z}Ga_zAs$ quantum well, where z represents the percent of Ga in a quantum well and can range from about 0.7 to about 0.99, or about 0.7 to about 0.98, or about 0.7 to about 0.9, or about 0.8, and where 1-z represents the percent of In in the quantum well and can range from about 0.3 to about 0.01, or about 0.3 to about 0.02, or about 0.3 to about 0.1, or about 0.5.

In one embodiment, the active region can include an $In_{1-z}Ga_zAs_yP_{1-y}$ quantum well where z represents the group III mole fraction of Ga in a quantum well and can range from about 0.7 to about 0.99, or about 0.7 to about 0.98, or about 0.7 to about 0.9, or about 0.8; and y represents the group V mole fraction of As in a quantum well and can range from about 0.6 to about 1, or about 0.6 to 0.98, or about, 0.8 to about 0.95.

In one embodiment, the active region can include a GaP transitional layer between each quantum well and quantum well barrier. In one aspect, the GaP transition layer is devoid of In. In another aspect, the transitional layer can be devoid of As. In another aspect, the transitional layer can be pure GaP.

In one embodiment, the active region can include a transitional layer with an intermediate material that has GaP and is devoid of one or In or As, or devoid of In, or devoid of As, or devoid of In and As. For example, the transitional layer can be GaAsP or GaAs, or GaAsP and GaAs. For the transitional layer $GaAs_wP_{1-w}$ can have w range from 0 to about 1, or about 0.25 to about 0.75, or about 0.4 to about 0.6, or about 0.5.

It has been found that decomposition can occur at InGaP—InGaAs(P) interfaces such that As pairs with In, and Ga pairs with P, thereby creating an interface which has material close to InAs, which reduces the band gap dramatically at the interface. A material devoid of both the In and As at the interface is ideal as a transition layer between a quantum well having InGaAs(P) and a quantum well barrier having InGaP. The transition layer can include one or more monolayers of GaP, which can inhibit As paring with In, as the Ga is already paired with P and there is no In at the transition monolayers. Alternately, intermediate materials based on GaP which have a wider band gap than the InGaAs(P) well and which intermediate materials are devoid of one of either In or As can be used as the transition monolayers. Also, transition monolayers having GaAsP or even GaAs are reasonable.

In one embodiment, the active region can include one or more InGaP(As) barrier layers each having low or no As, and from about 25% to about 50% In of the Group III constituents, and optimally about 30% of the Group III constituents. The active region can include one or more InGaAs quantum wells, where the wells can be lower in the percent of In, such as around 12%. Additionally, the well can be high in As. Also, the well can be and low in P.

Without the transitional layer, at the interface between a quantum well and a quantum well barrier there can be intermediate compositions that exist which are not miscible, and then decompose into compositions which are miscible. This decomposition causes 3-D growth and rough interfaces, as well as a mixture of low and high band gap materials. It is well known that there exists a large miscibility gap in InGaAsP from which decomposition into components outside the miscibility gap occurs. The FIG. 3, which is reproduced from Stringfellow (Stringfellow; Immiscibility and Spinodal Decomposition in III/V alloys; *Journal of Crystal Growth;* 65(1983) 454-462; incorporated herein by specific reference), shows a diagram of this phenomenon. Inside the roughly circular regions the material tends to separate into materials outside the circular regions. The intermediate compositions between the quantum well and quantum well barrier are shown on the diagram. These compositions overlap the miscibility gap and result in As pairing with In and the formation of a low band gap material at the interface between the quantum well and quantum well barrier, which is undesirable. In addition, the Ga tends to pair with P, which is also undesirable as it allows for In and As to associate and forms materials outside the miscibility gap. The separation also tends to cause interfaces to become rough because it is an actual movement of material. The compositions can range as shown in FIG. 3.

The use of a transition material in the transitional layer that has an intermediate composition that is miscible with both the material of the quantum well and the material of the quantum well barrier, such as GaP, GaAs, or many compositions of GaAsP avoids the miscibility gap. The transitional layers may be able to include other elements and still provide the improvements described herein. For example, the transitional layer can include 1, 2, 3, 4, 5, or up to 9 or 10 monolayers of the materials described in order to prevent interdiffusion and cross-reactions between the quantum well and quantum well barriers.

In one embodiment, the barrier layer, transitional layer, and quantum well sequence of semiconductor material can be prepared by molecular beam epitaxy (MBE). The interfaces between InGaP and InGaAs(P) can be very difficult to manufacture due to the way the elements interact and associate with each other at the interface. The Group V elements interdiffuse with each other so that there is a region having all of the Group III materials interacting with all of the Group V elements, which is energetically unfavorable. The As can carry over into the next layer, and has a memory effect with regard to InGaAs (P), especially when the layer is formed in MOCVD reactors. The In and Ga can exchange places so that the In can sit adjacent to As and Ga can be adjacent P to cause cross-interaction exchange reaction. This creates low band gap interfacial layers, which are unfavorable in a VCSEL environment. In addition, the In can segregate to the surface of the interface, especially in compressive layers containing In such as the quantum well. All these effects make thin InGaP—InGaAs wells very difficult to manufacture.

It has been found that the use of transitional layers that are proactively prepared between quantum well and barrier layers can improve VCSEL function by inhibiting the Group V element interdiffusion and the In—Ga exchange. The interface between the quantum well and quantum well barrier can include GaP interfacial layers in the form of molecular lattice layers (i.e., interfacial monolayers) adjacent the wells so that an interfacial layer (e.g., transitional layer) is between a barrier and a quantum well. The GaP layers at the interface of InGaP quantum well barriers and InGaAs quantum well layers substantially reduce the interdiffusion effects. While the interdiffusion can still occur, the result is that the GaP layer is converted to an InGaAsP layer which is much wider gap than would be at the interface without the deposition of the GaP interfacial layer. Also, GaAsP interfacial layers may also be used.

The addition of one or more molecular monolayers of GaP, GaAs, or GaAsP to provide a transition layer at the interface of the quantum well and quantum well barrier can reduce the cross-interaction exchange reaction effects substantially.

In one embodiment, the active region or whole semiconductor layers of a VCSEL can be produced with molecular beam epitaxy (MBE). Lower growth temperatures during the MBE can now be used to prepare the VCSEL semiconductor layers with the transitional layer between the quantum well and the quantum well barrier. The lower growth temperatures can reduce these cross-interaction effects as well as a reactor which has less memory effects for the Group V materials. It has been found that MBE is dramatically better than MOCVD. The growth of these structures by MBE can be performed at <(less than) 500° C. Comparatively, the temperatures for MOCVD can be >(greater than) 600° C., and often much hotter which causes severe interdiffusion and enhances the Ga—In exchange reaction. In addition, arsine and arsenic stick to many surfaces in the MOCVD, and can make an abrupt transition to InGaP directly from InGaAs difficult. MBE has an arsenic memory effect, but it is essentially only on the surface of the growing wafer. When the shutter is closed and the arsenic valve is closed, the sources are gone. Thus, the benefits of preparing the active regions with the transitional layer between the quantum well and the quantum well barrier can include: formation with MBE at a low-enough temperature that reduces the Group V interdiffusion; reduction in the In—Ga exchange reaction; and forming abrupt transitions because the low arsenic memory effect makes abrupt transitions easier.

Additionally, the VCSELs can be prepared by methods that are similar to MBE, such as GSMBE (gas source MBE) and MOMBE (metalorganic MBE) or the like that can produce the transitional layers between the quantum well and quantum well barrier as described.

Various aspects of the present invention will now be illustrated in the context of a VCSEL. However, those skilled in the art will recognize that the features of the present invention can be incorporated into other light emitting semiconductor devices that have an active region.

FIG. 1 shows a planar, current-guided, VCSEL 100 having periodic layer pairs for top (124) and bottom (116) mirrors. A substrate 114 is formed on a bottom contact 112 and is doped with a first type of impurities (i.e., p-type or n-type dopant). A bottom mirror stack 116 is formed on substrate 114 and a bottom confining layer 118 is formed on bottom stack 116. The bottom confining layer 118 and a top confining layer 120 sandwich an active region 122. An upper mirror stack 124 is formed on the top confining layer 120. A metal layer 126 forms a contact on a portion of stack 124. However, other VCSEL configurations may also be utilized, and various other VCSEL layers or types of layers can be used.

An isolation region 128 restricts the area of the current flow 130 through the active region 122. Region 128 can be formed by an ion implantation and/or oxidation. Other isolation regions may be used as is known or developed for VCSEL devices.

Mirror stacks 116 (bottom) and 124 (top) can be distributed Bragg reflector (DBR) stacks, and include periodic layers (e.g., 132 and 134). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Figure 4:
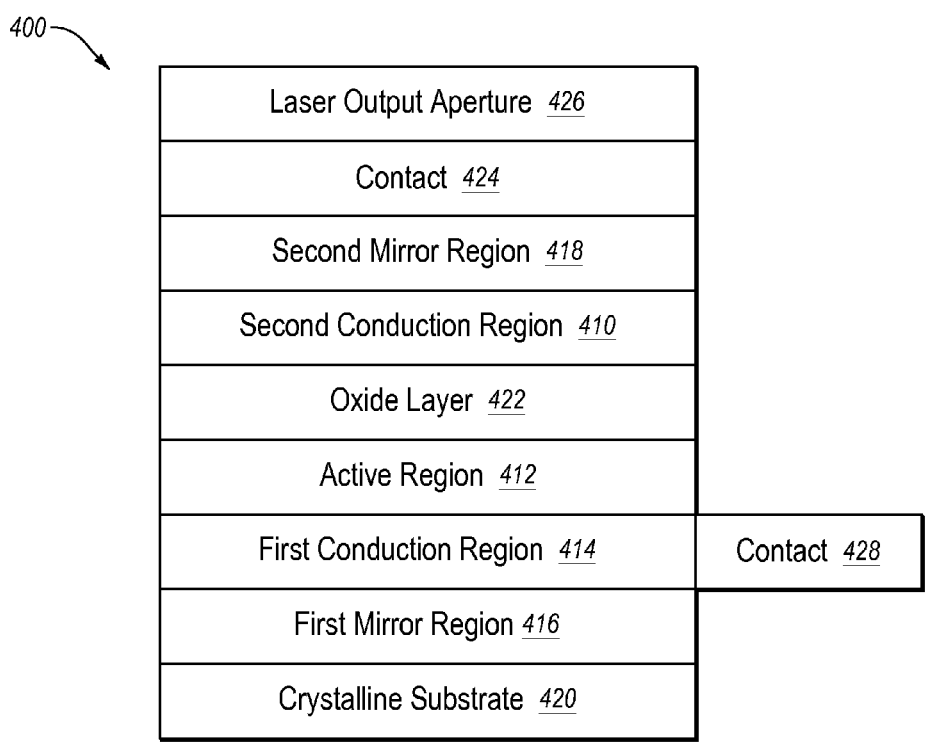
FIG. 4 is a schematic of an embodiment of semiconductor layers of a VCSEL.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through top mirror stack 124. Those skilled in the art will recognize that other configurations of contacts can be used to generate a voltage across active region 122 and generate light 136, such as illustrated in FIG. 4.

Figure 2:
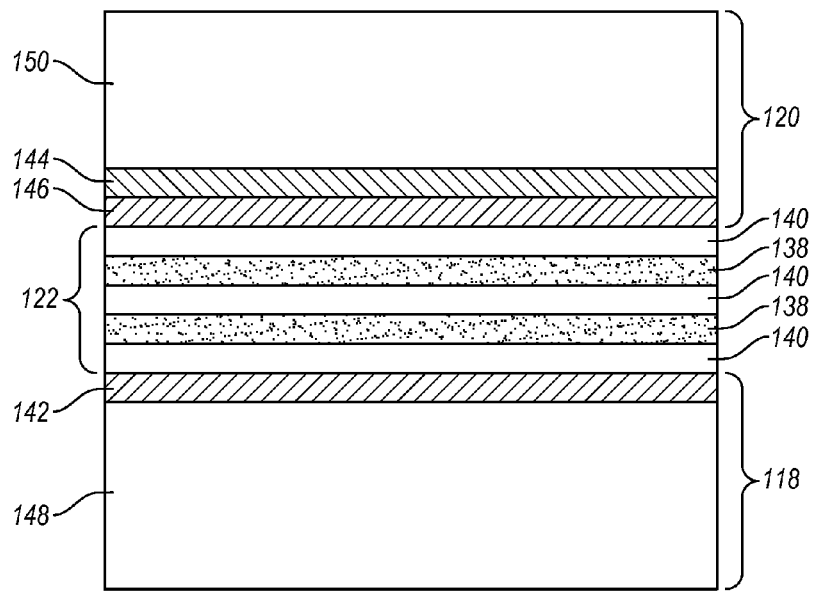
FIG. 2 is a schematic of an embodiment of a VCSEL layered semiconductor operating environment.

FIG. 2 illustrates the active region 122 and confining layers 118 and 120. Active region 122 is formed from one or more quantum wells 138 that are separated by quantum well barriers 140. While not specifically shown in FIG. 2, an advancement of the present invention includes transitional layers between each quantum well 138 and quantum well barrier 140, where the lines between the quantum wells 138 and quantum well barriers 140 may represent the transitional layers. The confining layers 118 and 120 may optionally include high aluminum content regions 142 and 144, respectively. The high aluminum content regions provide good carrier confinement in active region 122.

Confining region 120 can include a ramp region 146 that is positioned between active region 122 and high aluminum content region 144. As discussed below, the combination of high aluminum content region 144 and the ramp region 146 provide an injection structure with good carrier confinement and good electron injection.

Depending on the design of the VCSEL device and the thickness of high aluminum content regions 142 and 144, the confining regions 118 and 120 can optionally include spacer layers 148 and 150, respectively. The thickness of spacer layers 148 and 150 can be dependent upon the kind of VCSEL device being fabricated. In a vertical cavity resonant device such as a VCSEL, or VECSEL the spacer layers provide resonant spacing between mirrors and provide that the quantum wells of the active region are centered on a peak of the optical field if desired.

The confining layers 118 and 120 and active region 122 can be formed from one or more types of semiconductor materials, such as GaAs, AlAs, InP, AlGaAs, InGaAs, InAlAs, InGaP, AlGaAsP, AlGaInP, InGaAsP, InAlGaAs, SiGe, or the like.

In one example, the lower electrical confining layer is AlInP. In another example, the upper electrical confining layer can be AlInGaP.

FIG. 4 includes a schematic of a portion 400 of an embodiment of a VCSEL. The VCSEL 400 can include a crystalline substrate 420, a first mirror region 416, a first conduction region 414, a contact 428 associated with the first conduction region 414, an active region 412, an oxide layer 422, a second conduction region 410, a second mirror region 418, a contact 424, and a laser output aperture 426 arranged in an operable VCSEL format. Any of these components besides the active region 412 can be prepared as is standard in the art or developed for VCSELs.

The following description of the VSEL 400 can be used as an example; however, variations known in the art can be applied. The crystalline substrate 420 can be GaAs. The first mirror region 416 located on the GaAs substrate can have a plurality of first mirror layers having one or more indices of refraction. The first conduction region 414 can be operably coupled to the active region 412. The contact 428 can be associated with the first conduction region 414 so as to provide a path for electrons when the active region 412 is charged with electrical current. As described in more detail herein, the active region 412 can include one or more quantum wells bounded by one or more quantum well barrier layers, with a transitional layer between each quantum well and quantum well barrier. The oxide layer 422 can be any protective oxide such as silicon dioxide; however, protective nitrides or carbides may also be used. The second conduction region 410 can be operably coupled with the active region 412. The second mirror region 418 can be located on the second conduction layer and opposite of the active region, the second mirror region having a plurality of second mirror layers having one or more indices of refraction. The contact 424 can be any type of electrical contact for the conduction of electricity for operation of the active region. The laser output aperture 426 can be arranged in an operable VCSEL format.

Figure 5A:
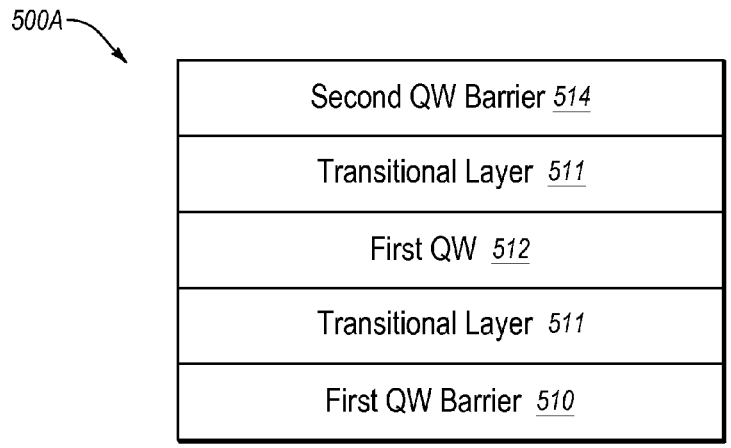

FIG. 5A includes a schematic representation of an embodiment of at least a portion of an active region 500a of a VCSEL. The active region 500a is shown to include in series: a first quantum well barrier (QW barrier) 510, a transitional layer 511, a first quantum well (QW) 512, a transitional layer 511, and then a second QW barrier 514. As shown, the active region 500a is the smallest unit of active region for a VCSEL in accordance with the present invention as there is only one quantum well 512 bound by two quantum well barriers 510, 514 with transitional layers 511 therebetween.

Figure 5B:
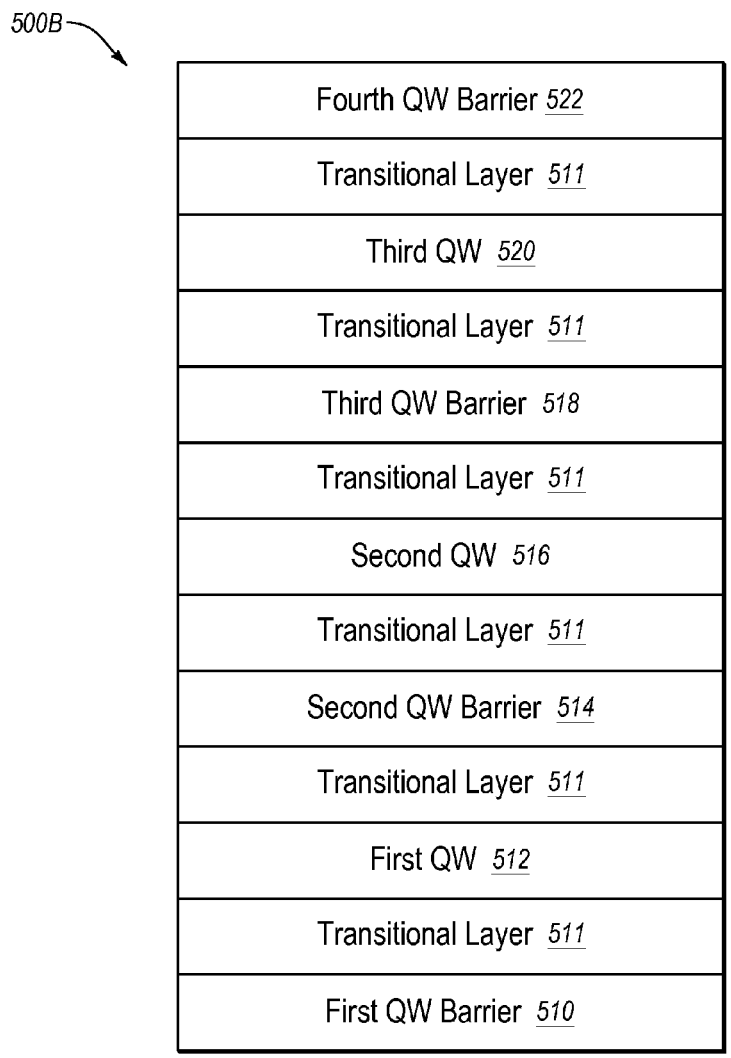

FIG. 5B includes a schematic representation of an embodiment of an active region 500b of a VCSEL. As shown, the active region 500b can include a first quantum well barrier (QW barrier) 510, a first quantum well (QW) 512, a second QW barrier 514, a second QW 516, a third QW barrier 518, a third QW 520, and a fourth QW barrier 522 with transitional layers 511 between the QWs and QW barriers. The active region 500b is arranged in an operable VCSEL format.

FIG. 5C includes a schematic representation of an embodiment of an active region 550 of a VCSEL. The active region 550 is shown to include in series: a first quantum well barrier (QW barrier) 560, a transitional layer 561, a first quantum well (QW) 562, a transitional layer 511, and so on with repetition thereof until an "Nth" QW barrier 564, a transitional layer 561, a "Nth" QW 566, a transitional layer 561, and then a "N+1" QW barrier 558. Here, N can be any reasonable number, such as from 1 to 20, or from 5 to 15 or from 10 to 13, or about 12. In this example, the quantum wells, quantum well barriers, and transitional layers an include any of the materials described herein.

FIG. 6 includes a schematic representation of an embodiment of an active region 600 of a VCSEL. The active region 600 is shown to include in series: a first $In_{1-x}Ga_xP$ quantum well barrier (QW barrier) 610, a GaP transitional layer 611, a first $In_{1-z}Ga_zAs$ quantum well (QW) 612, a GaP transitional layer 611, and so on with repetition thereof until an "Nth" $In_{1-x}Ga_xP$ QW barrier 614, a GaP transitional layer 611, a "Nth" $In_{1-z}Ga_zAs$ QW 616, a GaP transitional layer 611, and then a "N+1" $In_{1-x}Ga_xP$ QW barrier 618. Here, N can be any reasonable number, such as from 1 to 20, or from 5 to 15 or from 10 to 13, or about 12.

Figure 7:
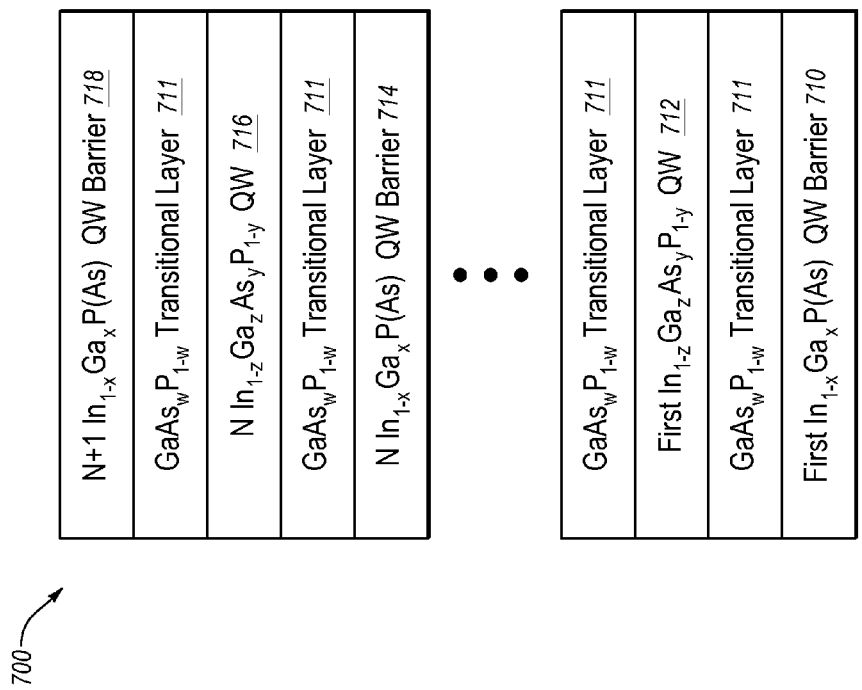
FIG. 7 is a schematic of an embodiment of an active region of a VCSEL.

FIG. 7 includes a schematic representation of an embodiment of an active region 700 of a VCSEL. The active region 700 is shown to include in series: a first $In_{1-x}Ga_xP(As)$ quantum well barrier (QW barrier) 710, a $GaAs_wP_{1-w}$ transitional layer 711, a first $In_{1-z}Ga_zAs_yP_{1-y}$ quantum well (QW) 712, a $GaAs_wP_{1-w}$ transitional layer 711, and so on with repetition thereof until an "Nth" $In_{1-x}Ga_xP(As)$ QW barrier 714, a $GaAs_wP_{1-w}$ transitional layer 711, a "Nth" $In_{1-z}Ga_zAs_yP_{1-y}$ QW 716, a $GaAs_wP_{1-w}$ transitional layer 711, and then a "N+1" $In_{1-x}Ga_xP(As)$ QW barrier 718. Here, N can be any reasonable number, such as from 1 to 20, or from 5 to 15 or from 10 to 13, or about 12.

Figure 8:
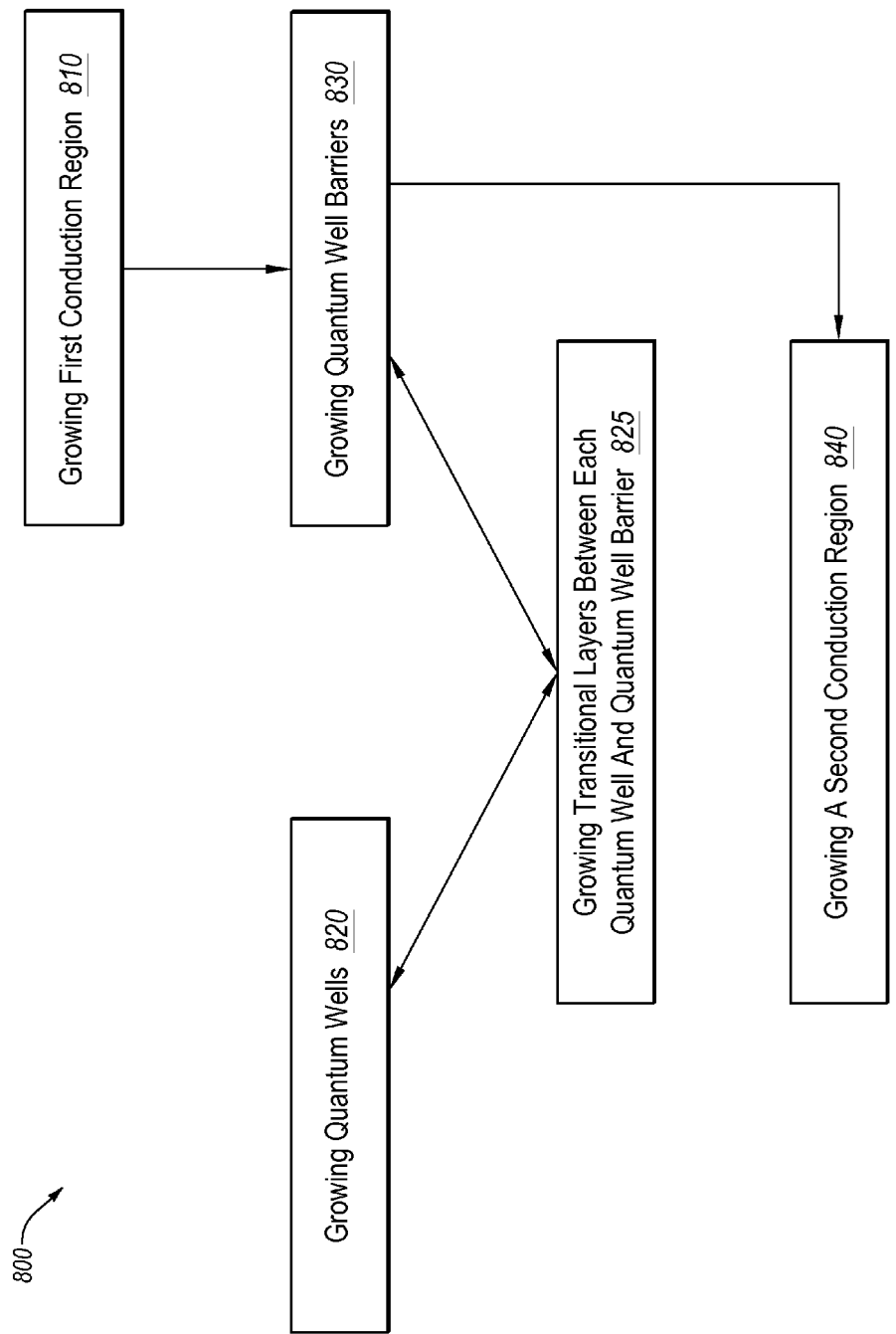
FIG. 8 is a flow diagram of an embodiment of a method of manufacturing a VCSEL.

FIG. 8 is a flow diagram of processes 800 of an embodiment of a method of manufacturing a VCSEL having an active region with the features described herein. The process can include: (1) growing a first conduction region (block 810); (2) growing one or more quantum well layers (block 820) and growing one or more quantum well barriers so as to be operably coupled with each of the quantum well layers (block 830) and growing one or more transitional layers between each quantum well and quantum well barrier. The transitional layer can be configured with a composition and thickness to provide a higher band gap than when the quantum well and quantum well barrier are touching (block 825). The process 800 can include growing a second conduction region (block 840) on the active region. The process 800 is generic to show the growth of the active region having quantum wells (block 820), quantum well barriers (block 830), and transitional layers between the quantum wells and quantum well barriers (block 825). As such, the process can include: forming a quantum well barrier (block 830), forming a transitional layer (block 825), forming a quantum well (block 820), forming a transitional layer (block 825), and then forming a quantum well barrier (block 830). After the last quantum well barrier is formed (block 830), the second conduction region (block 840) can be formed.

Figure 9:
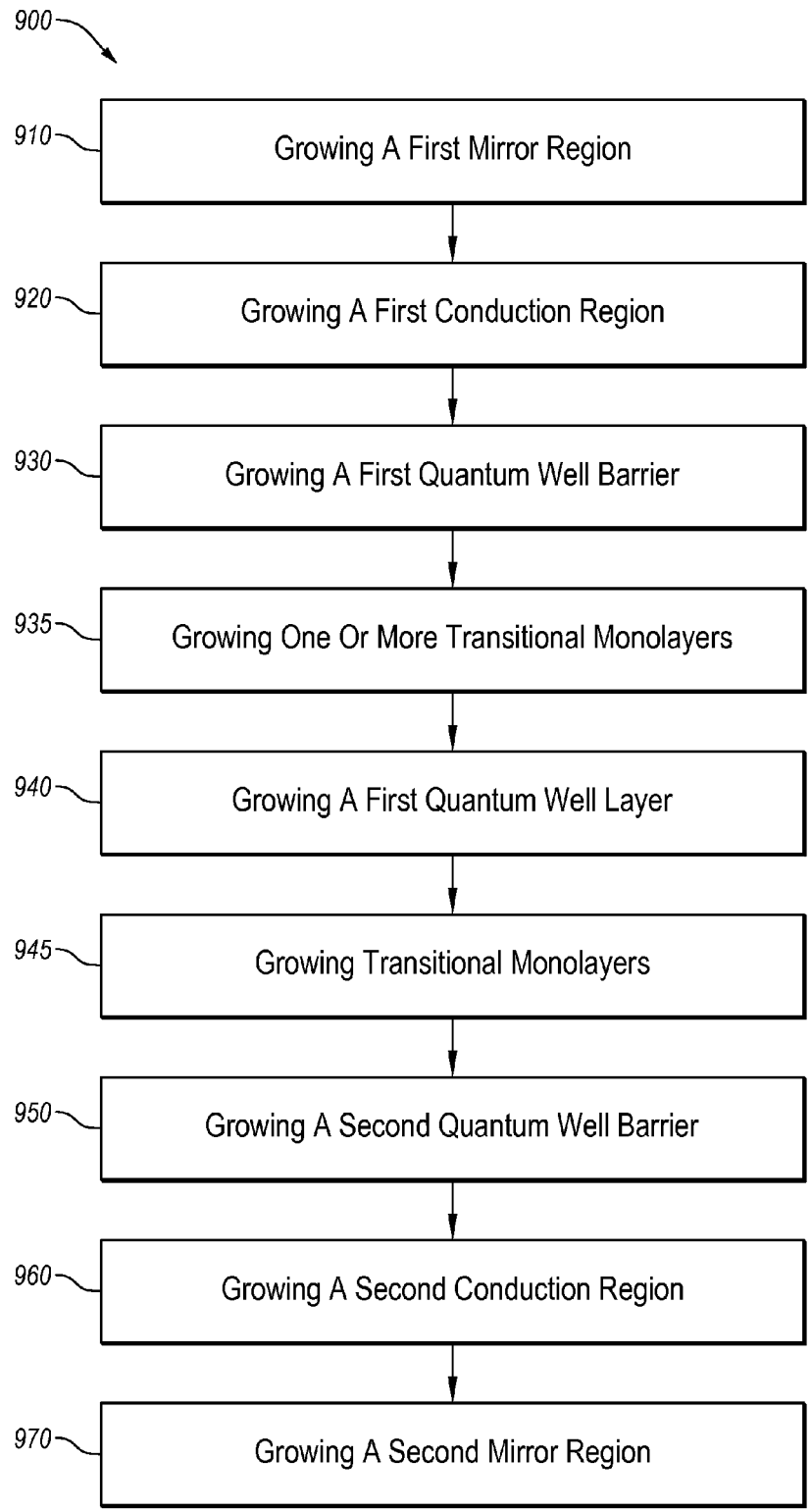
FIG. 9 is a flow diagram of an embodiment of a method of manufacturing a VCSEL.

FIG. 9 is a flow diagram of another process 900 of an embodiment of a method of manufacturing a VCSEL. The process can includes growing a first mirror region having a plurality of first mirror layers having one or more indices of refraction (block 910) and then growing a first conduction region over the first mirror region (block 920). Then a first quantum well barrier is grown over the first conduction region (block 930). Subsequently, one or more transitional monolayers is grown over the first quantum well barrier (block 935) before growing a first quantum well layer over the one or more transitional monolayers (block 940), and then growing one or more transitional monolayers over the first quantum well layer (block 945), before growing a second quantum well barrier over the one or more transitional monolayers (block 950). The process 900 can also include growing a second conduction region (block 960) on the last quantum well barrier layer, and then growing a second mirror region having a plurality of second mirror layers having one or more indices of refraction (block 970).

Figure 10:
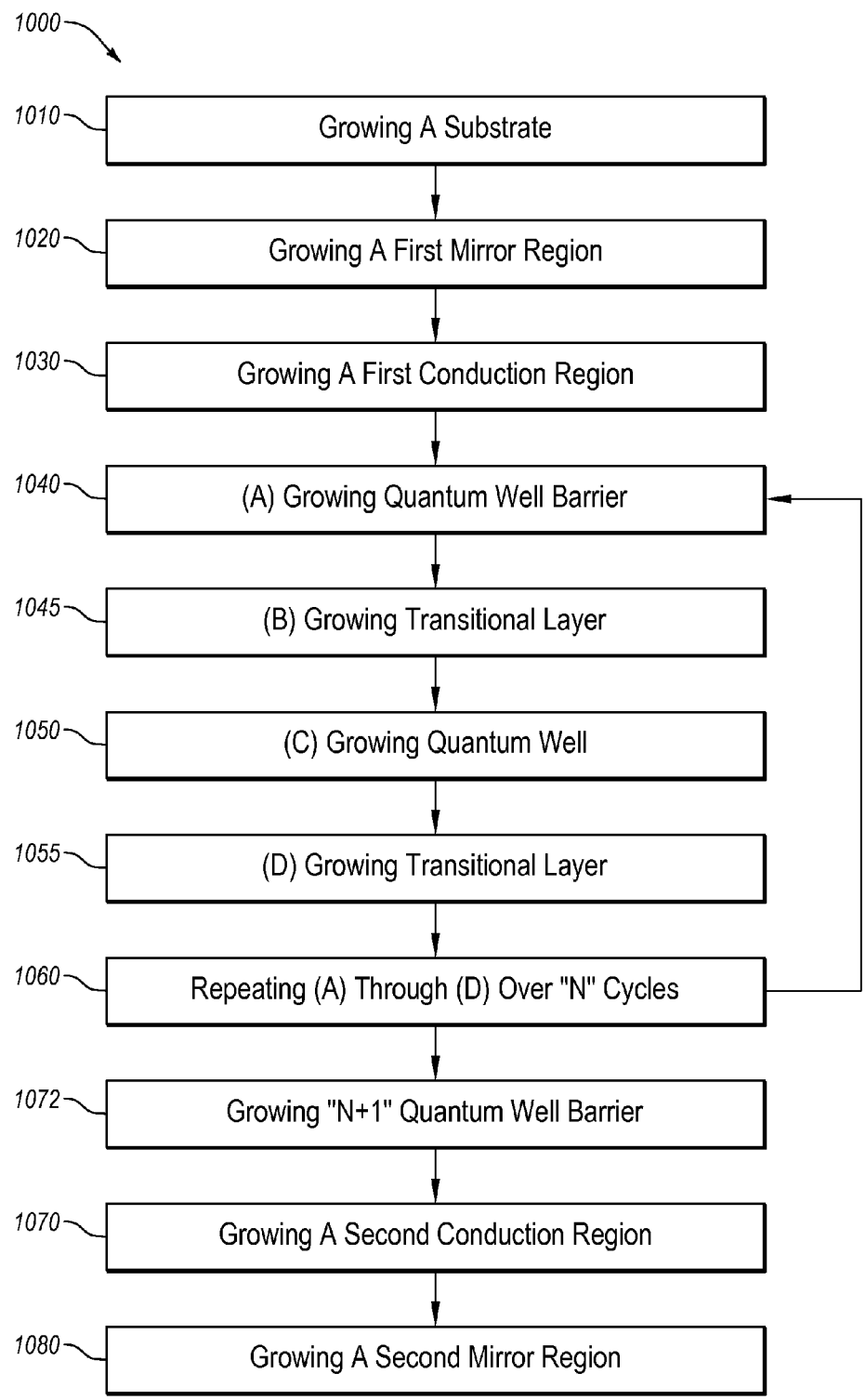
FIG. 10 is a flow diagram of an embodiment of a method of manufacturing a VCSEL.

FIG. 10 is a flow diagram of a process 1000 of another embodiment of a method of manufacturing a VCSEL. The process can include: growing a substrate (block 1010), growing a first mirror region having a plurality of first mirror layers having one or more indices of refraction (block 1020), growing a first conduction region over the first mirror region (block 1030), (a) growing a first quantum well barrier having GaP over the first conduction region (block 1040), (b) growing an transitional layer (block 1045), (c) growing a first quantum well layer over the first quantum well barrier (block 1050), (d) growing an transitional layer (1055), (e) repeating processes (a)-(d) over a plurality of cycles (block 1060), such as "N" cycles, growing an "N+1" quantum well barrier (block 1062). A second conduction region (block 1070) can be grown over the active region, and a second mirror region having a plurality of second mirror layers having one or more indices of refraction can be grown on the second conduction region (block 1080).

In one embodiment, the active regions can be configured to include one or more of the following features: thin quantum wells with low P; GaP quantum well transitional layers around quantum wells; thin GaP quantum well transitional layers; tensile quantum well barriers; InGaP quantum well barriers having about 32% In; InGaAs(P) wells with less than or about 10% P, and optionally no P; or a carbon doped AlGaAs to modulation dope AlInGaP p-type injection layer. When a layer is represented by a formula having (As) or (P), it is designated that As or P is optional in that layer or the P is present in low amounts.

In one embodiment, the VCSEL can be configured by modulating the quantum wells and quantum well barriers such that the spatial extent of the fundamental wavefunction for either of the electron or hole carriers is 85% or less than that of the other carrier, which enhances the matrix element. This can be done with InGaP barriers and with InGaAs(P) wells. Also, this can be done by making the physical size on one well less than that of the other well. For example using Sb at the boundary between common quantum wells and quantum well barriers widens the hole well relative to the electron well. Using Sb as a supplement in the well makes the electron well shallower, decreasing its confinement relative to the holes allowing some more spreading of the wavefunction relative to the holes. The carrier wavefunction relative spatial extent percentage can be less than or about 70, or less than or about 55%.

Such modulation can be obtained by use of the transitional layers at boundaries between quantum wells and quantum well barriers or by judicious choice of quantum well and barrier materials and dimensions. The enhancement of the matrix element is contemplated to benefit all semiconductor lasers and all devices which use quantum wells for optical interaction such as electroabsorption modulators.

In one embodiment, the InGaP quantum well barriers and InGaAs(P) quantum wells can be substantially free of Al. Lowering Al can improves reliability due to problems associated with growth of Al compounds.

In one embodiment, the quantum well barriers on either side of a quantum well can have a thickness of from about 40 A to about 100 A or about 45 A to about 75 A, or about 50 A to about 60 A, or about 55 A. The relative thinness improves gain saturation by decreasing diffusion lengths and increasing the minority carrier population over the quantum well. The relative thinness can also enhance carrier transport through the quantum wells with tunneling. In one embodiment, the quantum well can have a thickness of from about 40 A to about 100 A or about 45 A to about 75 A, or about 50 A to about 60 A, or about 55 A. Outer quantum well barriers that bound the active region can be thicker at 100 A to about 140 A, or about 110 A to about 130 A, or about 120 A to about 125 A, or about 130 A.

In one embodiment, the quantum wells can be substantially devoid of P. Such reduction of P in these quantum wells can improve VCSEL speed.

In one embodiment, the VCSEL can be grown without Be. Such a VCSEL can include about 85-100% AlGaAs as the p-type injection layer behind an AlInGaP upper electrical confining layer (See FIG. 14).

In one embodiment, the VCSEL can include double oxide layers to reduce capacitance with flare on both, but primarily on the first oxide layer. That is, the oxide layer 422 of FIG. 4 can be prepared of two different oxide layers. While shown to be planar, the oxide layer 422 can be of any shape and may be located on walls surrounding an active region, such as a mesa active region, or the like. Also, the oxide layer 422 can cover the active region 412, second conduction region 410, and second mirror region 418.

In one embodiment, the VCSEL includes substantial periodic doping with heavy doping at nulls in high mobility materials. Also, the mirror can be configured to be not quite ¼ ¼. In some instances, the mirrors can begin adjacent the quantum wells or quantum well barriers with the first oxide at the first null.

To enhance speed and adjust wavelength, various quantities of In and P are added to the quantum wells. In can be added to the quantum wells to enhance speed. This results in a depression of the energy level to longer wavelengths so the wells are narrowed. The resulting wavefunction can penetrate into the quantum well barrier with its high density of states. To compensate for this, the barrier is grown to provide a maximum conduction band offset and provide the most carrier confinement. If the band offset is insufficient, then narrower wells can be used to allow the maximum In without significant penetration into the barriers.

InGaP can be used as the quantum well barriers because it has superior optical characteristics compared to other barrier materials. The InGaP quantum well barrier can be lattice matched to GaAs transitional layers with good band offset in the valence band, however, it may be low in the conduction band. The low band offset can be improved by using tensile strained InGaP in the barrier layers, with an In composition of about 32%. This provides approximates 0.35 ev band offset in both the conduction and valence band and the density of states of the InGaP is low for the conduction band, the penetration of the wavefunction into the barrier layer in the valence band is low.

Also, poor transport through the active region from one well to another well can arise in deep wells. Poor transport can be alleviated by having the barrier thin enough for substantial tunneling.

Figure 11A:
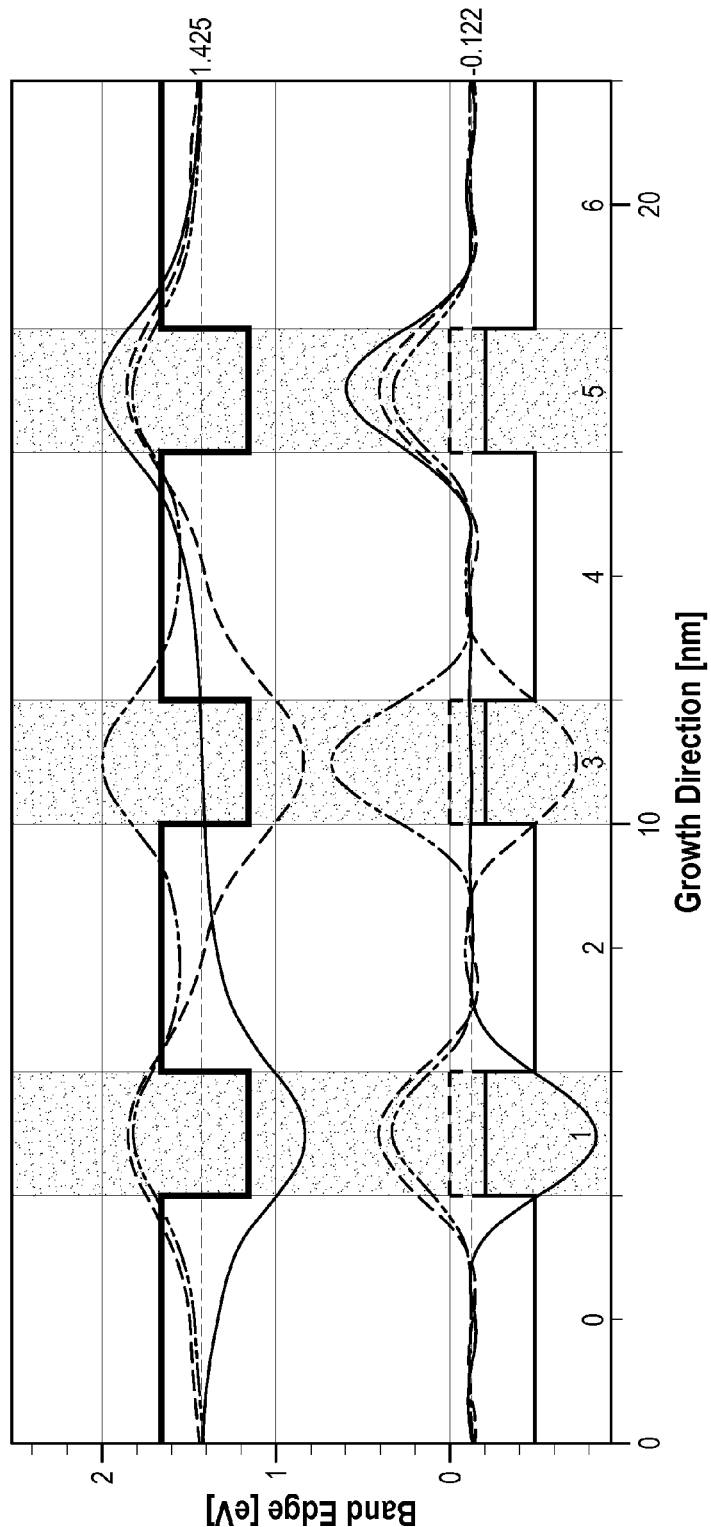
FIGS. 11A-11B include graphs that illustrate Band Edge (eV) versus Growth Direction of wavefunctions of embodiments of VCSELs.
Figure 11B:
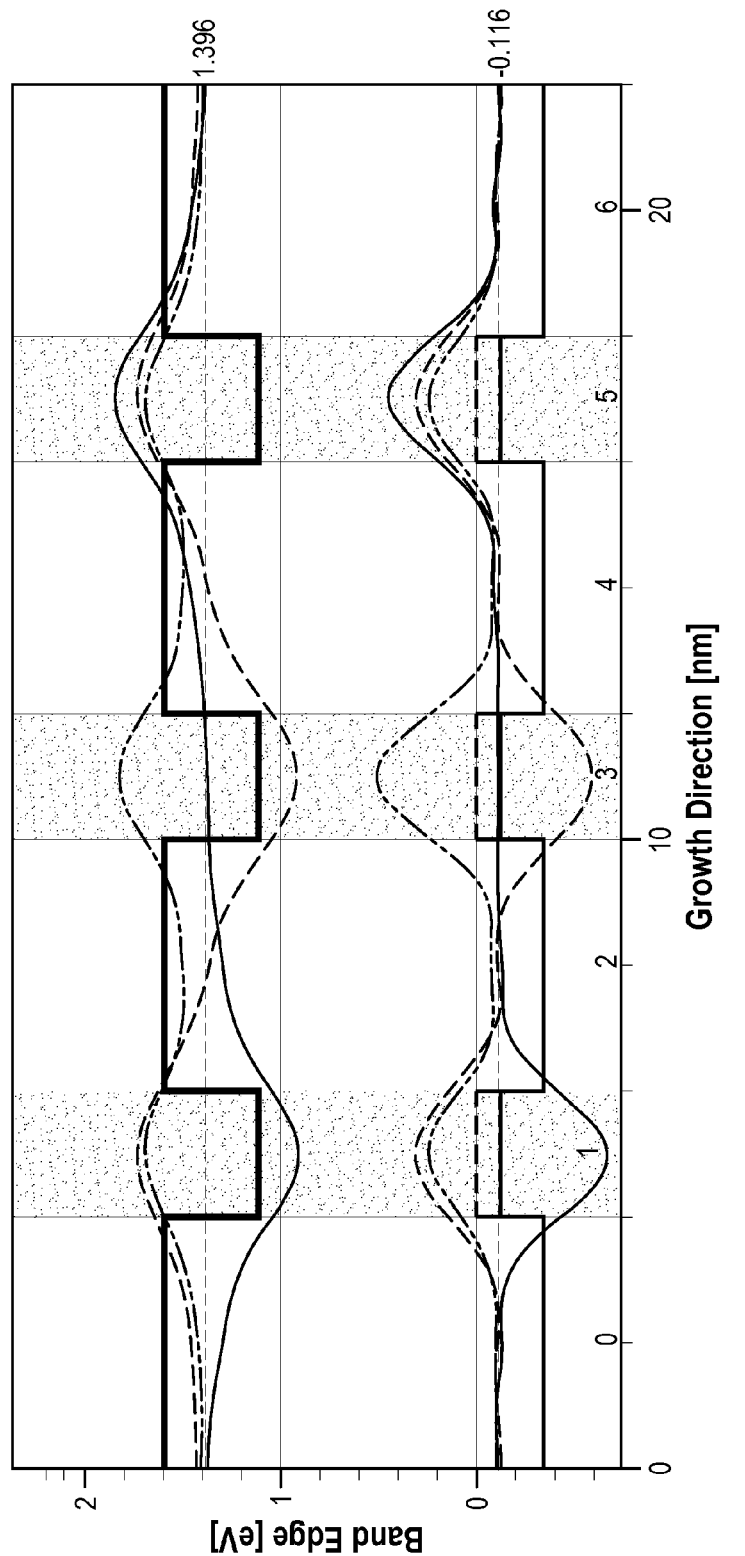

An example of quantum wells designed using these principles is shown in the Simulase images of the wavefunctions in FIGS. 11A-11B. Note the displayed n=1 electron wavefunctions are much more spread out than the hole wavefunctions. This gives an enhancement of the matrix element. FIG. 11A shows an InGaP—InGaAs active region. FIG. 11B shows an InGaP—InGaAs active region with 40% AlGaAs quantum well barriers. If compared with 40% AlGaAs barriers (FIG. 11B) with the same InGaAs wells, a similar effect is observed, except the wavefunctions extend into poor barrier materials, which causes an adverse effect on the density of states in the quantum wells due to the barrier material and the extension into them. This shows a lower hole effective mass in the InGaP combined with the deeper well. While the lower hole effective mass causes greater penetration into the barrier, the increased well depth compensations for this reducing the penetration, and with the lower hold effective mass in the barriers the overall effective mass and thus the density of states in the valence band which is observed for the first level. The conduction bands have similar density of states, where reduced density of states enhances the gain/differential gain significantly. Both of the active regions of FIGS. 11A and 11B can be used with the present invention.

Figure 12A:
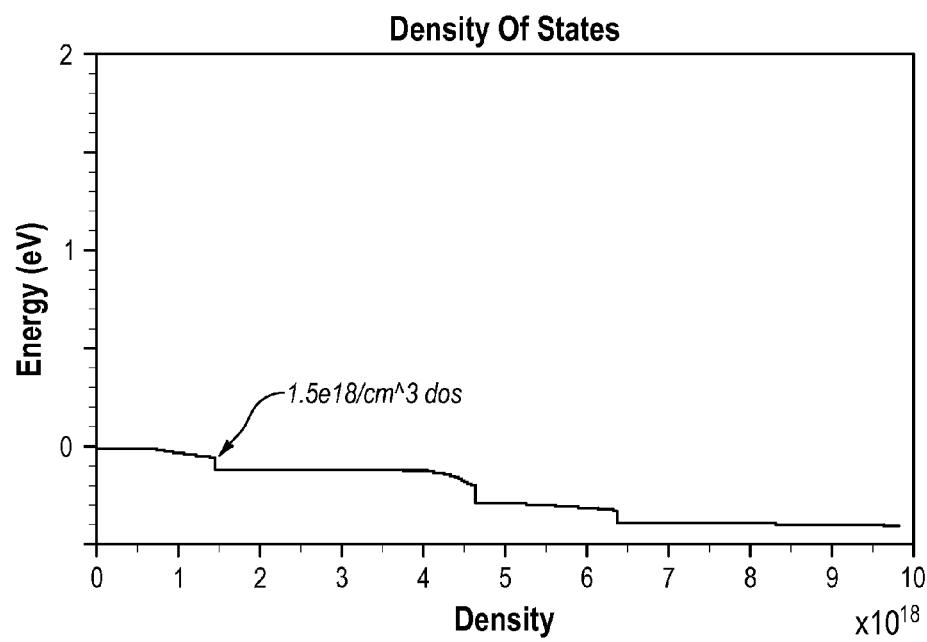
FIG. 12 includes a graph that illustrates density of states of an embodiment of a VCSEL.
Figure 12B:
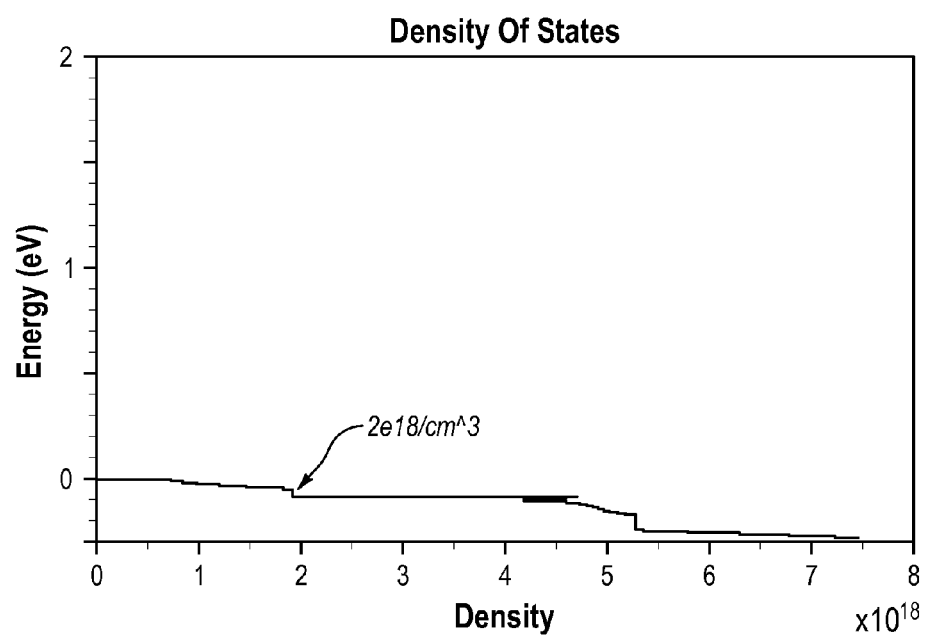
Figure 12C:
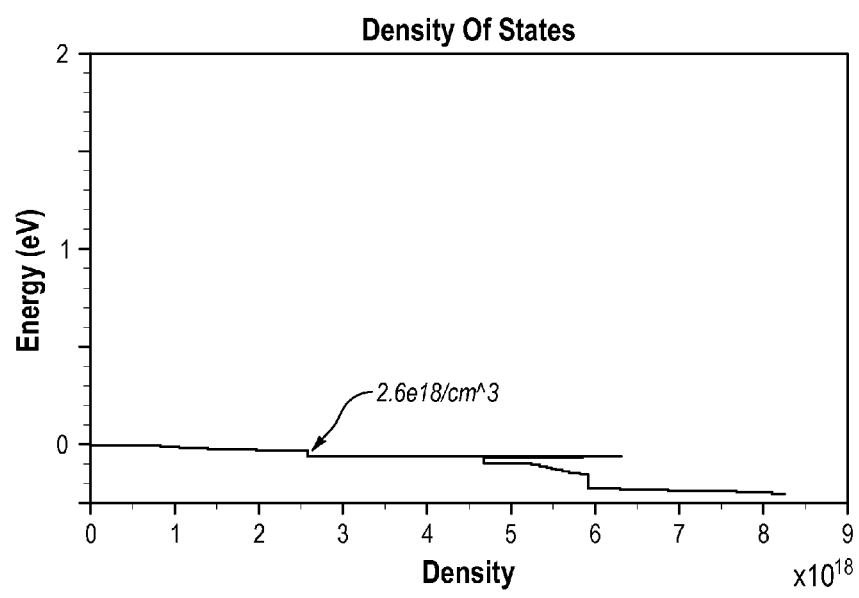

The greater quantum well depth gives what is the greatest performance advantage to the InGaP—InGaAs quantum wells. If the gain spectra of the AlGaAs—InGaAs well is adjusted to roughly match that of the InGaP—InGaAs well then about 7% In is used (compared versus 12% In), and the valence band density of states becomes as shown in the density of states of FIGS. 12A-12C (e.g., about $2.6e18/cm^3$ up dramatically from the 1.5e18 of the InGaP—InGaAs well). FIG. 12A shows an InGaP—InGaAs active region. FIG. 12B shows an AlGaAs—InGaAs and having same dimensions and In content as in FIG. 12A. FIG. 12C shows an AlGaAs—InGaAs active region while reducing In to match gain spectrum.

Figure 13A:
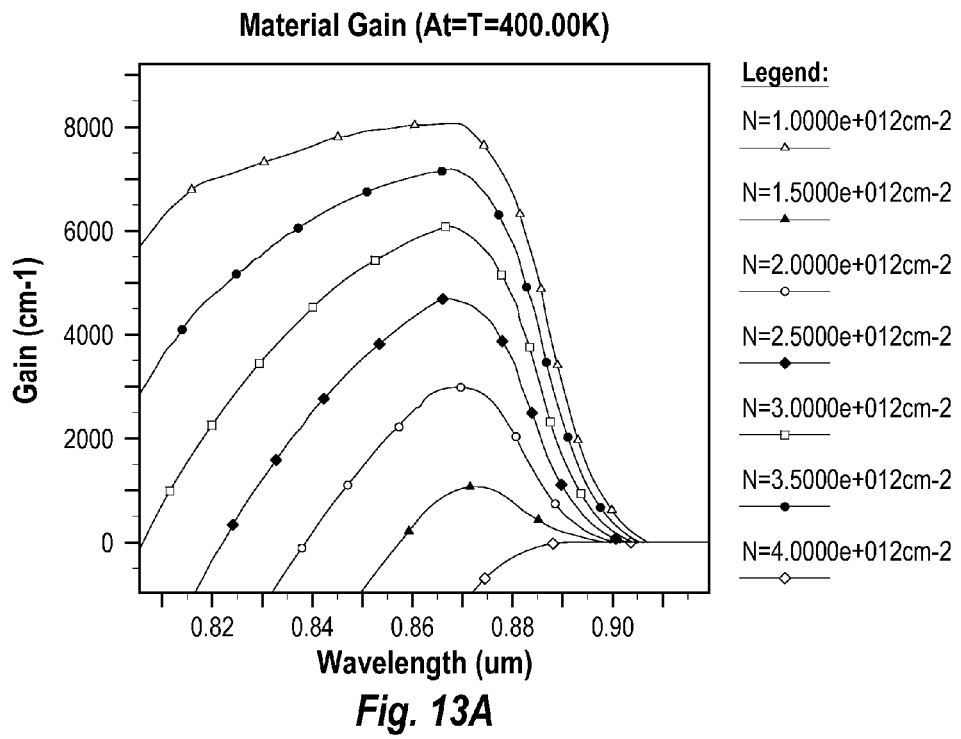
FIG. 13 includes a graph that illustrates the wavelength gain of an embodiment of a VCSEL.
Figure 13B:
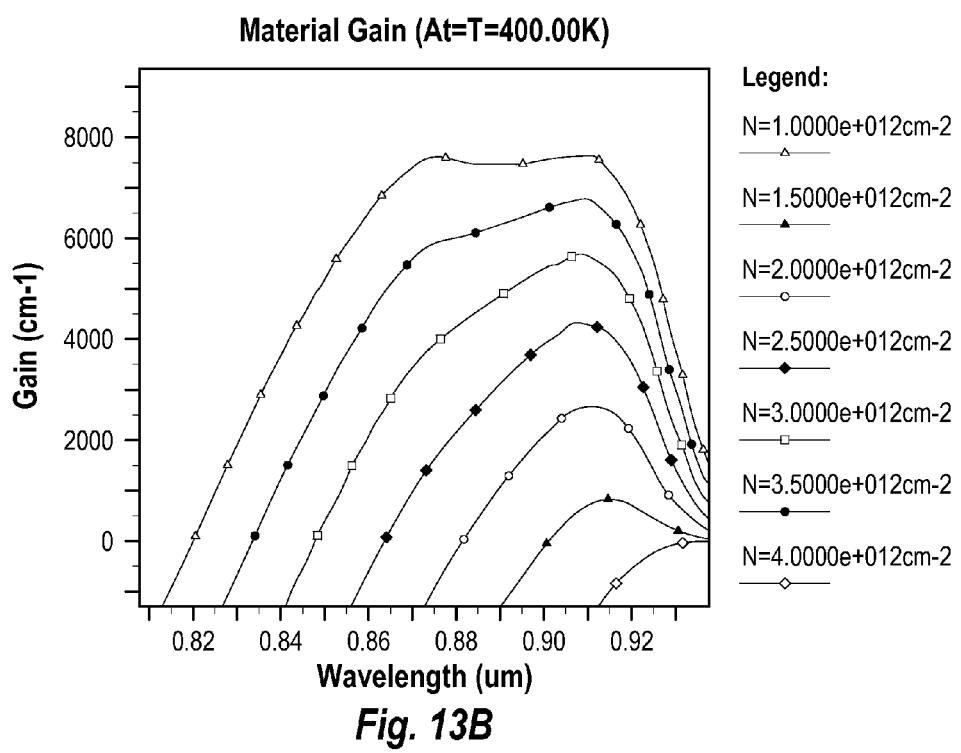
Figure 13C:
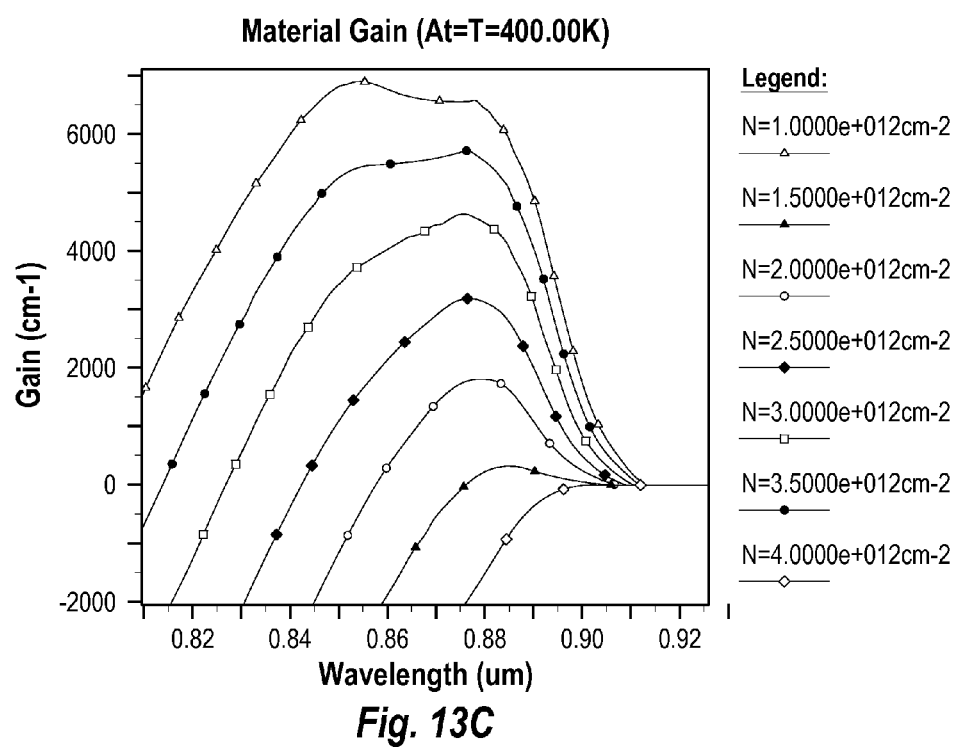

The gain is also reduced and transparency increased as shown in the gain of FIGS. 13A-13C. FIG. 13A shows an InGaP—InGaAs active region. FIG. 13B shows an AlGaAs—InGaAs active region with the same dimensions and In content as in FIG. 13A. FIG. 13C shows the AlGaAs—InGaAs with reduced In to match gain spectrum. When the Gain or differential gain is reduced, transparency increases. Also the carrier concentration in the wells increases the gain eventually saturates. The mirror losses can be low enough that the device operates in a region of high differential gain (e.g., large spacing between the curves).

Relaxation into the wells can be enhanced by having a narrow active region. The number of wells can be reduced to one well (FIG. 5A), but with imperfect processing the mirror reflectivity may become so high (to avoid the gain saturating due to approaching the limit) that photon lifetime would slow down the device. Instead minimizing the dimensions of the quantum well barriers is preferable, such as the dimensions described herein. This also enhances tunneling transport between the wells which reduces the effective diffusion time as the states are coupled anyway.

Figure 14:
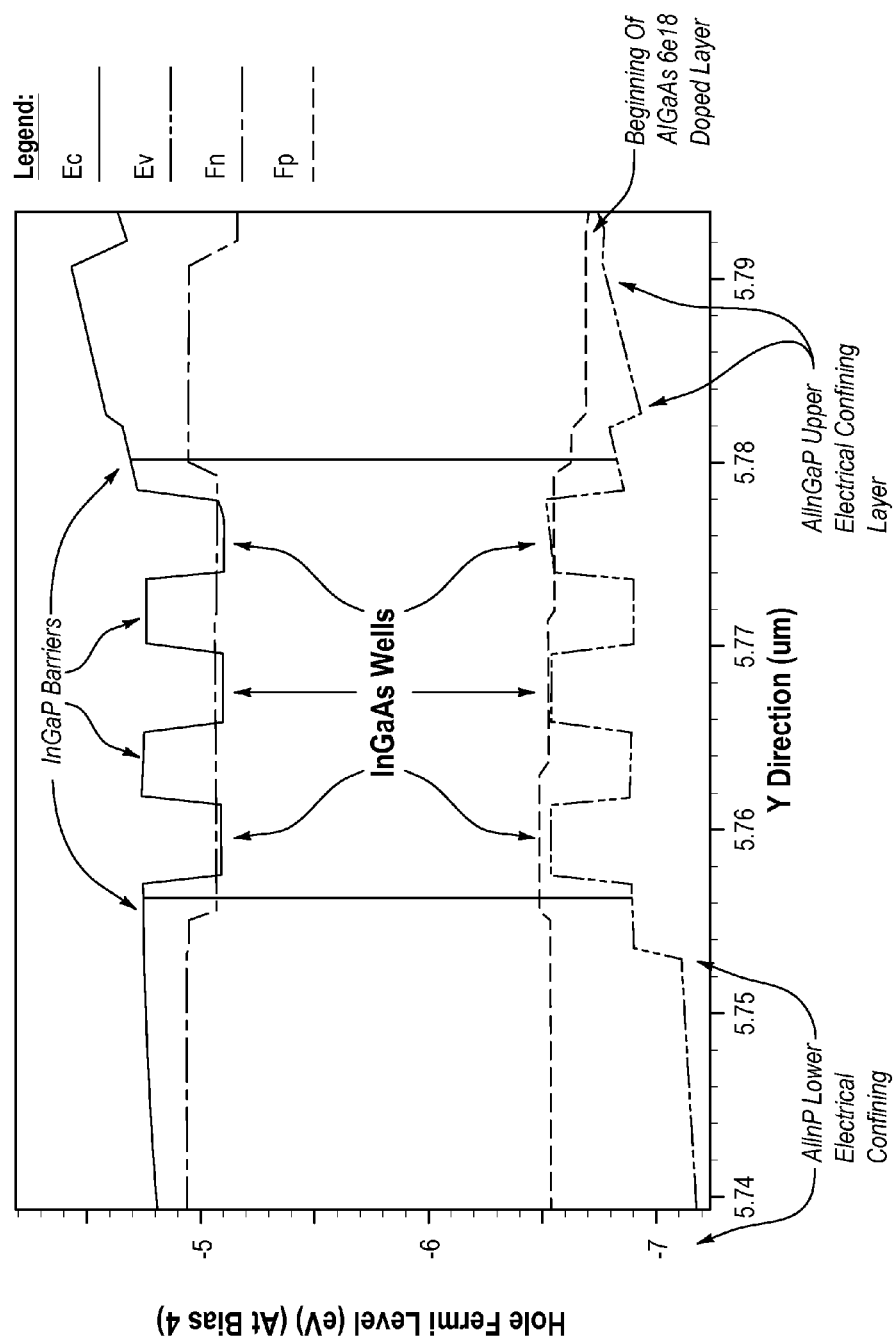
FIG. 14 includes a graph that illustrates hole femi level of a VCSEL.

FIG. 14 includes a graph of the hole femi level of an embodiment of a VCSEL. As shown, the VCSEL has InGaP barriers that are 40 A thick with about 33% In. The InGaAs quantum wells are 43 A thick with about 12.5% In. The graph also shows a lower electrical confining layer of AlInP below the active region and an upper electrical confining layer of AlInGaP. At the end, there is a region of AlGaAs having 6e18 doping.

Table 1 provides an example of a VCSEL. In Table 1, the quantum wells are shown to be thin. Also, the GaP transitional layers can become InGaAsP with the interdiffusion from the quantum wells and quantum well barriers. The computing system can be programmed with computer-executable instructions to deposit the layers as described in Table 1.

In one embodiment, a VCSEL can include: a GaAs substrate; a first mirror region located on the GaAs substrate and having a plurality of first mirror layers having one or more indices of refraction; a first conduction region located on the first mirror region; and an active region located on the first conduction region opposite of the first mirror region. The active region can include: one or more quantum well layers; one or more quantum well barriers; and one or more transitional (e.g., interfacial) monolayers having GaP deposited between each of the quantum well layers and quantum well barriers. A second conduction region can be located on the active region opposite of the first conduction region. A second mirror region can be located on the second conduction layer and opposite of the active region, the second mirror region can have a plurality of second mirror layers having one or more indices of refraction.

In one embodiment, each quantum well and quantum well barrier can be separated by one or more transitional monolayers having GaP, GaAs, and/or GaAsP.

In one embodiment, the active region includes one or more transitional monolayers between the quantum well barrier and quantum well, which one or more transitional monolayers being formed from a third material selected such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the active region can include: a quantum well barrier prepared from InGaP; a quantum well prepared from InGaAs that is substantially devoid of P; and one or more transitional monolayers between the quantum well barrier and quantum well. The one or more transitional monolayers can be formed from GaAsP or GaP or GaAs such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the quantum well layers can have lower P compared to the one or more quantum well barriers. Also, the quantum well barriers can have lower Al compared to the one or more quantum well layers.

In one embodiment, the VCSEL can include one or more electrical confining layers outside the active region. Optionally, the VCSEL can include a lower and an upper electrical confining layer sandwiching an active region. The electrical confining layers can include AlInGaP, or AlGaAs.

In one embodiment, one or more quantum wells have AlGaAs—InGaAs.

In one embodiment, the one or more quantum well barriers can additionally include Al. The Al can be present in the one or more quantum well barriers in trace amounts. The Al can be present the one or more quantum well barriers in a sufficiently low amount to be negligible within a lattice structure of the quantum well barriers. On the other hand, the quantum well barriers can be substantially devoid of Al. here, the Al is present in the quantum well layers and/or quantum well barriers in a trace amount of less than or about 1% Al, less than or about 0.1% Al, less than or about 0.01% Al, less than or about 0.001% Al, or less than or about 0.0001% Al.

In one embodiment, an active region can include: a quantum well barrier prepared from AlInGaP; a quantum well prepared from InGaAsP that is substantially devoid of P; and one or more transitional monolayers between the quantum well barrier and quantum well, the one or more transitional monolayers being formed from GaAsP or GaP such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the one or more transitional monolayers can include InGaP or InGaAsP formed from one or more deposited transitional monolayers of GaP or GaAsP such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, an active region can include: a quantum well barrier prepared from InGaP; a quantum well prepared from InGaAs that is substantially devoid of P; and one or more transitional monolayers between the quantum well barrier and quantum well, the one or more transitional monolayers comprising InGaP or InGaAsP formed from one or more deposited monolayers of GaP or GaAsP such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the active region can include a tensile strained quantum well barrier.

In one embodiment, the active region can include one or more transitional monolayers between the quantum well barrier and quantum well. The one or more transitional monolayers can be formed from a third material selected such that group III interdiffusion and/or group V interdiffusion with the quantum well barrier and/or quantum well results in one or more transitional monolayers having a wider band gap compared to a low band gap interface that results from group III interdiffusion and/or group V interdiffusion between the quantum well barrier and quantum well without the one or more transitional monolayers.

In one embodiment, the first conduction region or second conduction region is configured as an injection region. The injection region is configured to inject electron carriers or holes into the one or more quantum well layer. The injection region can includes about 85% to about 100% AlGaAs at a p-type injection layer. In one option, the injection region can include AlGaAs at a p-type injection layer adjacent to an AlInGaP layer. Alternately, the injection region includes AlInGaP. In yet another option, the injection region can include carbon doped AlGaAs, such as an amount sufficient to modulation dope AlInGaP in a p-type injection layer.

In one embodiment, the one or more quantum well boundaries include one or more GaP, GaAs, and/or GaAsP interface layers at one or more interfaces of one or more quantum wells, wherein the GaP, GaAs, and/or GaAsP interface layer is present in a sufficient amount to inhibit formation of a low gap transitional layer.

In one embodiment, the active region is devoid of a low gap transitional layer between a quantum well layer and a quantum well barrier.

In one embodiment, the active region is configured such that a spatial extent of a fundamental wavefunction for an electron carrier or a hole carrier is about 85%, 70%, 55% or less compared to a fundamental wavefunction for the other carrier. Here, a fundamental wave function for one carrier is sufficiently less than the fundamental wavefunction of the other carrier so as to enhance a matrix element.

In one embodiment, the quantum well P content is less than or about 20%, 10%, 5%, 1%, 0.1%. In another embodiment, the quantum well barrier As content is less than or about 20%, 10% 5%, 1%, 0.1%.

In one embodiment, the quantum well barriers are configured to confine carriers of the active region. In another embodiment, the quantum well barriers are configured to inhibit carrier wavefunction evanescence into the quantum well barriers. Here, the inhibition of evanescence is compared to the VCSEL without the transitional layers between the quantum wells and quantum well barriers. For example, the one or more transitional monolayers are configured to increase differential gain of the active region, wherein the increase of differential gain is compared to the VCSEL without the one or more transitional monolayers.

In one embodiment, the VCSEL semiconductor can include a double oxide configured to reduce capacitance. Also, the VCSEL can include an oxide layer at a first null with respect to the one or more quantum wells and an associated mirror region.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

TABLE 1

| layer | Repeats or comments | | t (nm) | Xs | Ramp = "R" | n doping | Ramp = "R" | p doping | Ramp = "R" |
|---|---|---|---|---|---|---|---|---|---|
| 1 | | AlGaAs | 250.00 | 0 | | 3.00E+18 | | | |
| 2 | | AlGaAs | 15.00 | 1 | R | 3.50E+18 | | | |
| 3 | | AlAs | 3.00 | 1 | | 3.50E+18 | | | |
| 4 | | AlAs | 21.41 | 1 | | 3.50E+18 | | | |
| 5 | | AlAs | 27.41 | 1 | | 1.30E+18 | | | |
| 6 | 35 | AlAs | 3.00 | 1 | | 3.50E+18 | | | |
| 7 | | ramp | 15.00 | 0.15 | R | 3.50E+18 | | | |
| 8 | | AlGaAs | 23.32 | 0.15 | | 1.30E+18 | | | |
| 9 | | AlGaAs | 23.32 | 0.15 | | 3.50E+18 | | | |
| 10 | | AlGaAs | 15.00 | 1 | R | 3.50E+18 | | | |
| 11 | | AlAs | 3.00 | 1 | | 3.50E+18 | | | |
| 12 | | AlAs | 24.41 | 1 | | 3.50E+18 | | | |
| 13 | | AlAs | 24.41 | 1 | | 1.30E+18 | | | |
| 14 | | AlAs | 3.00 | 1 | | 3.50E+18 | | | |
| 15 | | ramp | 15.00 | 0.15 | R | 3.50E+18 | | | |
| 16 | | AlGaAs | 23.32 | 0.15 | | 1.30E+18 | | | |
| 17 | | AlGaAs | 23.32 | 0.15 | | 3.50E+18 | | | |
| 18 | | AlGaAs | 15.00 | 1 | R | 3.50E+18 | | | |
| 19 | | AlAs | 3.00 | 1 | | 3.50E+18 | | | |
| 20 | | AlAs | 21.41 | 1 | | 3.50E+18 | | | |
| 21 | | AlAs | 27.41 | 1 | | 1.30E+18 | | | |
| 22 | | AlAs | 3.00 | 1 | | 3.50E+18 | | | |
| 23 | | ramp | 15.00 | 0.15 | R | 3.50E+18 | | | |
| 24 | | AlGaAs | 23.32 | 0.15 | | 1.30E+18 | | | |
| 25 | | AlGaAs | 23.32 | 0.15 | | 3.50E+18 | | | |
| 26 | | ramp | 15.00 | 0.92 | R | 3.50E+18 | | | |
| 27 | | AlGaAs | 3.00 | 0.92 | | 3.50E+18 | | | |
| 28 | | AlGaAs | 24.01 | 0.92 | | 3.50E+18 | | | |
| 29 | | AlGaAs | 24.05 | 0.92 | | 1.30E+18 | | | |
| 30 | | AlGaAs | 2.96 | 0.92 | | 3.50E+18 | | | |
| 31 | | ramp | 15.00 | 0.15 | R | 3.50E+18 | R | | |
| 32 | | AlGaAs | 13.45 | 0.15 | | 1.30E+18 | | | |
| 33 | | AlGaAs | 35.00 | 0.15 | | 3.50E+18 | | | |
| 34 | | AlGaAs | 10.00 | 0.28 | R | 3.50E+18 | | | |
| 35 | Skip from 0.2 Al to 0.5 Al to avoid DX center | Ga•5In•5P-Al•5In•5P | 15.00 | | | 3.50E+18 | R | | |
| 36 | | Al•5In•5P | 20.00 | | | 3.50E+18 | | | |
| 37 | | Al•5In•5P | 15.00 | | | 0.00E+00 | R | | |
| 38 | | In•33Ga•65P | 4.77 | | | | | | |
| 39 | | GaP | 2 ml (ml means monolayer) | | | | | | |
| 40 | 3 | In•11•6GaAs | 3.41 | | | | | | |
| | | GaP | 1 ml | | | | | | |
| 41 | | In•33Ga•65P | 4.77 | | | | | | |
| | | GaP | 2 ml | | | | | | |
| 42 | | Al•35Ga•15In•5P | 10.00 | | | | | | |
| 43 | | GaP | 2 ml | | | | | | |
| 44 | | AlGaAs | 31.50 | 0.92 | | | | 6.00E+18 | |
| 45 | | ramp | 20.00 | 0.15 | R | | | 4.00E+18 | |
| 46 | | | 48.29 | 0.15 | | | | 5.50E+17 | |
| 47 | | ramp | 10.00 | 0.735 | R | | | 5.00E+18 | |
| 48 | | | 3.00 | 0.735 | | | | 5.00E+18 | |
| 49 | | | 36.65 | 0.735 | | | | 1.20E+18 | |
| 50 | | | 5.00 | 0.98 | R | | | 5.00E+18 | |
| 51 | | Oxide | 32.44 | 0.98 | | | | 6.00E+18 | |
| 52 | | ramp | 11.00 | 0.15 | R | | | 6.00E+18 | R |
| 53 | | AlGaAs | 19.00 | 0.15 | | | | 5.50E+17 | |
| 54 | | ramp | 11.00 | 0.92 | R | | | 6.00E+18 | R |
| 55 | | AlGaAs | 3.04 | 0.92 | | | | 6.00E+18 | |
| 56 | | AlGaAs | 23.25 | 0.92 | | | | 2.00E+18 | |
| 57 | | Sec oxide | 28.32 | 0.97 | | | | 6.00E+18 | |
| 58 | | | 3.04 | 0.92 | | | | 6.00E+18 | |
| 59 | | ramp | 11.00 | 0.15 | R | | | 1.00E+19 | |
| 60 | | AlGaAs | 16.52 | 0.15 | | | | 1.00E+19 | |
| 61 | | AlGaAs | 46.44 | 0.15 | | | | 5.50E+17 | |
| 62 | 4 | ramp | 11.00 | 0.92 | R | | | 6.00E+18 | |
| 63 | | AlGaAs | 3.04 | 0.92 | | | | 6.00E+18 | |
| 64 | | AlGaAs | 22.82 | 0.92 | | | | 1.00E+18 | |
| 65 | | AlGaAs | 18.41 | 0.92 | | | | 5.00E+18 | |

TABLE 1-continued

| layer | Repeats or comments | | t (nm) | Xs | Ramp = "R" | n doping | Ramp = "R" | p doping | Ramp = "R" |
|---|---|---|---|---|---|---|---|---|---|
| 66 | | | 3.04 | 0.92 | | | | 8.00E+18 | |
| 67 | | ramp | 11.00 | 0.15 | R | | | 1.00E+19 | |
| 68 | | AlGaAs | 16.52 | 0.15 | | | | 1.00E+19 | |
| 69 | | AlGaAs | 38.09 | 0.15 | | | | 1.00E+18 | |
| 70 | 10 | ramp | 11.00 | 0.92 | R | | | 6.00E+18 | |
| 71 | | AlGaAs | 3.04 | 0.92 | | | | 6.00E+18 | |
| 72 | | AlGaAs | 29.35 | 0.92 | | | | 2.00E+18 | |
| 73 | | | 18.11 | 0.92 | | | | 8.00E+18 | |
| 74 | | AlGaAs | 3.04 | 0.92 | | | | 8.00E+18 | |
| 75 | | ramp | 11.00 | 0.15 | R | | | 1.00E+19 | |
| 76 | | AlGaAs | 51.60 | 0.15 | | | | 1.00E+19 | |
| 77 | 9 | ramp | 11.00 | 0.92 | R | | | 1.00E+19 | |
| 78 | | AlGaAs | 57.35 | 0.92 | | | | 1.00E+19 | |
| 79 | | ramp | 20.00 | 0.15 | R | | | 1.00E+19 | R |
| 80 | | AlGaAs | 24.95 | 0.15 | | | | 4.00E+19 | |
| 81 | | GaAs | 21.50 | 0 | | | | 8.00E+19 | |

The invention claimed is:

1. A vertical cavity surface emitting laser (VCSEL) comprising:
one or more $In_{1-z}Ga_zAs$ quantum wells;
two or more $In_{1-x}Ga_xP$ quantum well barriers bounding the one or more quantum well layers; and
one or more transitional monolayers being GaP deposited between each quantum well layer and quantum well barrier,
wherein:
x ranges from 0.75 to 0.50; and
z ranges from 0.6 to 0.99.

2. The VCSEL of claim 1, comprising:
one or more of the transitional monolayers being formed from GaP such that group III interdiffusion and/or group V interdiffusion with the quantum well barrier and/or quantum well results in one or more of the transitional monolayers having a wider band gap compared to a low band gap interface that results from group III interdiffusion and/or group V interdiffusion between the quantum well barrier and quantum well without the one or more transitional monolayers.

3. The VCSEL of claim 1, comprising:
one or more transitional monolayers being InGaP or InGaAsP formed from one or more deposited interfacial monolayers of the transitional monolayers of GaP such that group III interdiffusion and/or group V interdiffusion with the quantum well barrier and/or quantum well results in one or more of the transitional monolayers having a wider band gap compared to a low band gap interface that results from group III interdiffusion and/or group V interdiffusion between the quantum well barrier and quantum well without the one or more transitional monolayers.

4. The VCSEL of claim 1, comprising one or more electrical confining layers outside the quantum well barrier layers.

5. The VCSEL of claim 4, wherein one or more electrical confining layers include AlInGaP and/or AlGaAs.

6. The VCSEL of claim 1, wherein the one or more transitional monolayers is sufficient to inhibit formation of a low gap interfacial layer between the quantum walls and quantum well barriers.

7. The VCSEL claim 1, wherein the quantum well barriers are configured to inhibit carrier wavefunction evanescence into the quantum well barriers, wherein the inhibition of evanescence is compared to the VCSEL without the quantum well transitional layers.

8. The VCSEL claim 1, wherein the one or more transitional monolayers are configured to increase differential gain of the active region, wherein the increase of differential gain is compared to the VCSEL without the one or more transitional monolayers.

9. The VCSEL of claim 1, comprising an oxide layer between the one or more quantum well barrier layers and at least one of a first conduction region and a second conduction region bounding the quantum well barrier layers, wherein the oxide layer is:
a double oxide configured to reduce capacitance; or
at a first null with respect to the one or more quantum wells and an associated mirror region.

10. A method for preparing a VCSEL, the VCSEL comprising:
one or more $In_{1-z}Ga_zAs$ quantum wells;
two or more $In_{1-x}Ga_xP$ quantum well barriers bounding the one or more quantum well layers; and
one or more transitional monolayers being GaP deposited between each quantum well layer and quantum well barrier,
wherein:
x ranges from 0.75 to 0.50; and
z ranges from 0.6 to 0.99;
the method comprising:
using molecular beam epitaxy (MBE) for growing a crystalline structure having:
the one or more quantum wells;
the two or more quantum well barriers bounding each of the one or more quantum wells; and
the one or more transitional monolayers deposited between each quantum well layer and quantum well barrier.

11. The method of claim 10, comprising:
forming the one or more transitional monolayers between the quantum well barrier and quantum well, the one or more transitional monolayers comprising InGaP or InGaAsP formed from one or more deposited monolayers of GaP such that group III interdiffusion and/or group V interdiffusion with the quantum well barrier and/or quantum well results in one or more transitional monolayers having a wider band gap compared to a low band gap interface that results from group III mterdiffusion and/or group V mterdiffusion between the quantum well barrier and quantum well without the one or more transitional monolayers.

12. The method of claim 10, comprising:
forming one or more electrical confining layers outside the quantum well barrier layers, the one or more electrical confining layers including AlInGaP and/or AlGaAs.

13. A method for preparing a vertical cavity surface emitting laser (VCSEL), the VCSEL comprising:
one or more $In_{1-z}Ga_zAs$ quantum wells;
two or more $In_{1-x}Ga_xP$ quantum well bounding the one or quantum well layers; and
one or more transitional monolayers being GaP deposited between each quantum well layer and quantum well barrier,
wherein:
x ranges from 0.75 to 0.50; and
z ranges from 0.6 to 0.99;
the method comprising:
using MBE for:
growing a first mirror region over a substrate, the first mirror region having a plurality of first mirror layers having one or more indices of refraction;
growing a first conduction region over the first mirror region;
growing an active region over the first conduction region opposite of the first mirror region, the growth of the active region comprising:
  (a) growing the quantum well barrier;
  (b) growing the transitional layer;
  (c) growing the quantum well layer;
  (d) growing another transitional layer;
  (e) repeating processes (a) through (d) over a plurality of cycles; and
  (f) growing the quantum well barrier;
growing a second conduction region over the active region opposite of the first conduction region; and
growing a second mirror region over the second conduction region, the second mirror region having a plurality of second mirror layers having one or more indices of refraction.

* * * * *